(12) United States Patent
Lee et al.

(10) Patent No.: US 12,369,475 B2
(45) Date of Patent: Jul. 22, 2025

(54) DISPLAY PANEL WITH SPACERS EVERY FOUR OR MORE PIXELS

(71) Applicant: Samsung Display Co., Ltd., Yongin-si (KR)

(72) Inventors: Sangshin Lee, Yongin-si (KR); Yonghwan Kim, Seoul (KR); Youngeun Ryu, Hwaseong-si (KR); Sangmin Kim, Suwon-si (KR); Byoung-Hun Sung, Hwaseong-si (KR); Seungjin Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 345 days.

(21) Appl. No.: 17/444,264

(22) Filed: Aug. 2, 2021

(65) Prior Publication Data

US 2022/0069022 A1 Mar. 3, 2022

(30) Foreign Application Priority Data

Sep. 1, 2020 (KR) .................. 10-2020-0111137

(51) Int. Cl.
*H01L 27/32* (2006.01)
*H10K 59/121* (2023.01)
*H10K 59/122* (2023.01)
*H10K 59/35* (2023.01)
*H10K 59/80* (2023.01)

(52) U.S. Cl.
CPC ......... *H10K 59/352* (2023.02); *H10K 59/121* (2023.02); *H10K 59/122* (2023.02); *H10K 59/8723* (2023.02)

(58) Field of Classification Search
CPC .................... H10K 59/121; H10K 59/122
See application file for complete search history.

(56) References Cited

U.S. PATENT DOCUMENTS

| | | | |
|---|---|---|---|
| 9,685,629 B2 | 6/2017 | Park | |
| 10,727,439 B2 | 7/2020 | Lim | |
| 2015/0207094 A1* | 7/2015 | Hwang | H10K 50/8428 257/88 |
| 2015/0311473 A1* | 10/2015 | Kim | H10K 59/122 |
| 2016/0254476 A1 | 9/2016 | Park | |
| 2017/0194399 A1* | 7/2017 | Cho | H10K 59/8723 |

(Continued)

FOREIGN PATENT DOCUMENTS

| | | |
|---|---|---|
| EP | 2940752 A1 | 11/2015 |
| KR | 10-2016-0104804 A | 9/2016 |

(Continued)

*Primary Examiner* — Peter Bradford
(74) *Attorney, Agent, or Firm* — Womble Bond Dickinson (US) LLP

(57) ABSTRACT

A display panel, in which a plurality of first emission areas, a plurality of second emission areas, and a plurality of third emission areas are defined, includes a first spacer spaced apart from one of the plurality of third emission areas in a first direction, a second spacer spaced apart from the first spacer in the first direction, and a plurality of protruding portions spaced apart from the plurality of third emission areas in a second direction crossing the first direction, wherein m third emission areas (m is an integer greater than or equal to 4) among the plurality of third emission areas are between the first spacer and the second spacer.

20 Claims, 28 Drawing Sheets

(56) References Cited

U.S. PATENT DOCUMENTS

| | | |
|---|---|---|
| 2018/0190731 A1 | 7/2018 | Park et al. |
| 2019/0140030 A1 | 5/2019 | Huangfu et al. |
| 2020/0343319 A1* | 10/2020 | Matsueda ............ H10K 59/131 |
| 2021/0408163 A1* | 12/2021 | Heo ................... H10K 59/8723 |

FOREIGN PATENT DOCUMENTS

| | | |
|---|---|---|
| KR | 10-1786446 B1 | 10/2017 |
| KR | 10-2019-0066326 A | 6/2019 |
| KR | 10-2019-0069166 A | 6/2019 |

* cited by examiner

DISPLAY PANEL WITH SPACERS EVERY FOUR OR MORE PIXELS

CROSS-REFERENCE TO RELATED APPLICATION

This application claims priority to and the benefit of Korean Patent Application No. 10-2020-0111137, filed on Sep. 1, 2020, the entire content of which is hereby incorporated by reference.

BACKGROUND

One or more embodiments of the present disclosure relate to a display panel with improved manufacturing yield and reliability.

A display panel may include a plurality of pixels. Each of the plurality of pixels may include a light emitting layer between electrodes facing each other. The light emitting layer may be formed through various suitable methods, and one of them may be a deposition method using a mask. The display panel may include spacers supporting the mask.

SUMMARY

One or more embodiments of the present disclosure provide a display panel with improved manufacturing yield and reliability.

One or more embodiments of the present disclosure provide a display panel in which a plurality of first emission areas, a plurality of second emission areas, and a plurality of third emission areas are defined, the display panel including: a first spacer spaced apart from one of the plurality of third emission areas in a first direction; a second spacer spaced apart from the first spacer in the first direction; and a plurality of protruding portions spaced apart from the plurality of third emission areas in a second direction crossing the first direction, wherein m third emission areas (m is an integer greater than or equal to 4) among the plurality of third emission areas are between the first spacer and the second spacer.

In one or more embodiments, the plurality of protruding portions may be arranged in the first direction between the first spacer and the second spacer, and the plurality of protruding portions may have the same shape.

In one or more embodiments, an interval between adjacent protruding portions among the plurality of protruding portions in a region near the first spacer may be greater than an interval between adjacent protruding portions in a central region between the first spacer and the second spacer.

In one or more embodiments, an interval between adjacent ones of the plurality of protruding portions may be the same.

In one or more embodiments, the plurality of protruding portions may be respectively adjacent to boundaries between adjacent third emission areas among the m third emission areas.

In one or more embodiments, the plurality of first emission areas and the plurality of second emission areas may be alternately arranged one by one along the first direction, and wherein the plurality of protruding portions may be respectively adjacent to boundaries between adjacent first emission area and second emission area among the plurality of first emission areas and the plurality of second emission areas.

In one or more embodiments, the plurality of protruding portions may include a first protruding portion spaced apart from the first spacer in the second direction, and a second protruding portion spaced apart from the first spacer in the first direction, and wherein a shape of the first protruding portion and a shape of the second protruding portion may be different from each other.

In one or more embodiments, the second protruding portion may include a first portion between adjacent first emission area and second emission area among the plurality of first emission areas and the plurality of second emission areas, a second portion extending from a first end portion of the first portion, and a third portion extending from a second end portion of the first portion, and wherein a width of the first portion in the first direction may be smaller than a maximum width of each of the second portion and the third portion in the first direction.

In one or more embodiments, an area of the first protruding portion may be smaller than an area of the second protruding portion.

In one or more embodiments, each of the first spacer and the second spacer may include a first portion, a second portion protruding from the first portion, and a third portion protruding from the first portion, wherein the second portion and the third portion may be spaced apart in the second direction with the first portion therebetween, and wherein on a plane, a shape of the first portion may be a square, and a shape of each of the second portion and the third portion may be a triangle.

In one or more embodiments, the plurality of protruding portions may include a first protruding portion and a second protruding portion coupled integrally with the first spacer, and a third protruding portion and a fourth protruding portion coupled integrally with the second spacer, wherein the first protruding portion and the second protruding portion may be spaced apart in the second direction with the first spacer therebetween, wherein the third protruding portion and the fourth protruding portion may be spaced apart in the second direction with the second spacer therebetween.

In one or more embodiments, the display panel may further include one light emitting layer between the first spacer and the second spacer, wherein the m third emission areas (m is an integer of 2 or more) may be defined in the one light emitting layer.

In one or more embodiments, the plurality of protruding portions may be adjacent to the one light emitting layer.

In one or more embodiments, a width of each of the plurality of third emission areas in the first direction may be greater than a width of the first spacer in the first direction, and wherein a width of each of the plurality of third emission areas in the second direction may be smaller than a width of the first spacer in the second direction.

In one or more embodiments, a width of the first spacer in the first direction may be greater than a width of each of the plurality of first emission areas and the plurality of second emission areas in the first direction, and wherein a width of the first spacer in the second direction may be greater than a width of each of the plurality of first emission areas and the plurality of second emission areas in the second direction.

In one or more embodiments of the present disclosure, a display panel includes: one light emitting layer; a first spacer; a second spacer spaced apart from the first spacer in a first direction with the one light emitting layer therebetween; and a plurality of protruding portions arranged along the first direction and spaced apart from the one light emitting layer in a second direction crossing the first direction.

In one or more embodiments, a plurality of first emission areas may be defined in the one light emitting layer.

In one or more embodiments, an area of each of the first spacer and the second spacer may be larger than an area of each of the plurality of protruding portions.

In one or more embodiments, an interval between adjacent protruding portions among the plurality of protruding portions may be the same.

In one or more embodiments, an interval between adjacent protruding portions among the plurality of protruding portions in a region near the first spacer may be greater than an interval between adjacent protruding portions in a central region between the first spacer and the second spacer.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
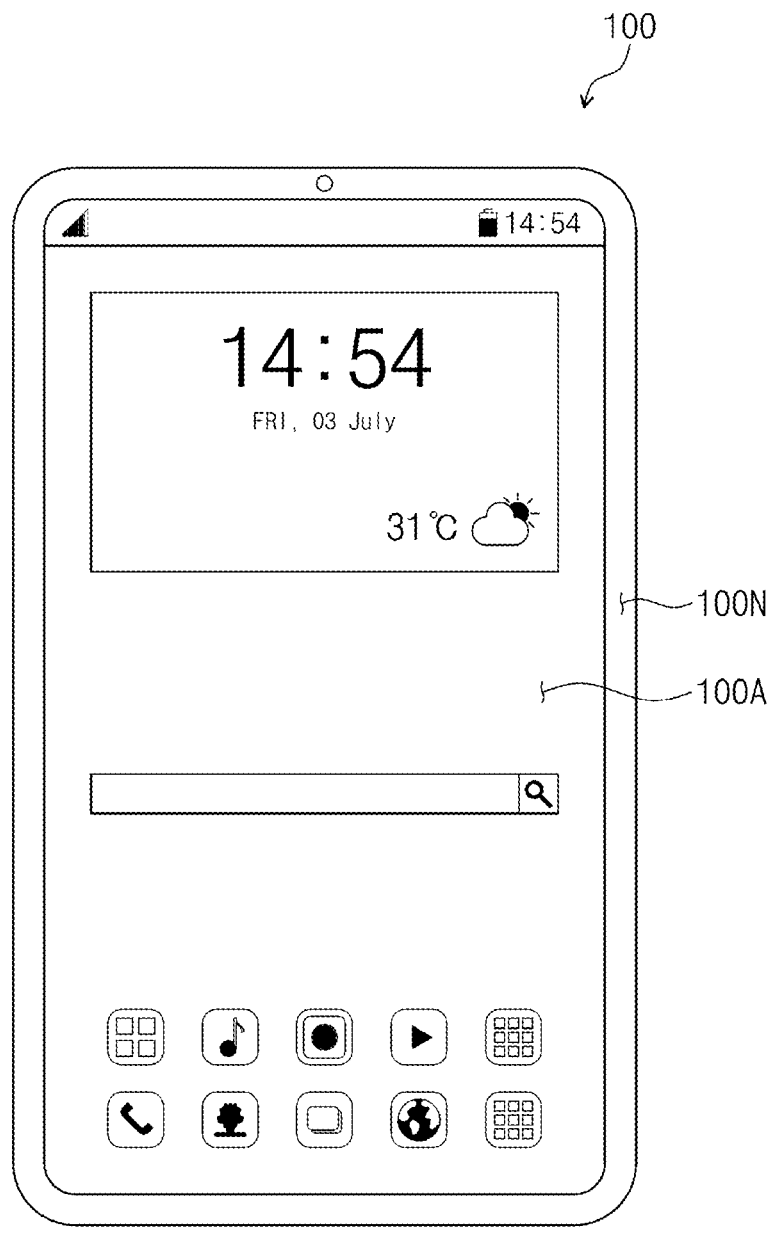
FIG. 1 is a plan view of a display device according to one or more embodiments of the present disclosure.

In this specification, when an element (or region, layer, part, etc.) is referred to as being "on", "connected to", or "coupled to" another element, it means that it may be directly placed on/connected to/coupled to other components (without any intervening third components therebetween), or a third component may be arranged between them.

Like reference numerals refer to like elements. Additionally, in the drawings, the thicknesses, proportions, and dimensions of components are exaggerated for effective description.

"And/or" includes all of one or more combinations defined by related components. As used herein, expressions such as "at least one of", "one of", and "selected from", when preceding a list of elements, modify the entire list of elements and do not modify the individual elements of the list. Further, the use of "may" when describing embodiments of the present disclosure refers to "one or more embodiments of the present disclosure".

It will be understood that the terms "first" and "second" are used herein to describe various components but these components should not be limited by these terms. The above terms are used only to distinguish one component from another. For example, a first component may be referred to as a second component and vice versa without departing from the scope of the present disclosure. The terms of a singular form may include plural forms unless otherwise specified.

In addition, terms such as "below", "the lower side", "on", and "the upper side" are used to describe a relationship of configurations shown in the drawings. The terms are described as a relative concept based on a direction shown in the drawings, and are intended to encompass different orientations of the device in use or operation in addition to the orientation depicted in the drawings.

Unless otherwise defined, all terms (including technical and scientific terms) used herein have the same meaning as commonly understood by one of ordinary skill in the art to which this present disclosure belongs. In addition, terms defined in a commonly used dictionary should be interpreted as having a meaning consistent with the meaning in the context of the related technology, and unless interpreted in an ideal or overly formal sense, the terms are explicitly defined herein.

In various embodiments of the present disclosure, the term "include," "comprise," "including," or "comprising," specifies a property, a region, a fixed number, a step, a process, an element and/or a component but does not exclude other properties, regions, fixed numbers, steps, processes, elements and/or components.

As used herein, the terms "use," "using," and "used" may be considered synonymous with the terms "utilize," "utilizing," and "utilized," respectively.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, embodiments of the present disclosure will be described with reference to the drawings.

FIG. 1 is a plan view of a display device according to one or more embodiments of the present disclosure.

Referring to FIG. 1, the display device 100 may be a device that is activated according to an electrical signal. For example, the display device 100 may be a mobile phone, a tablet, a car navigation system, a game console, and/or a wearable device, but is not limited thereto. In FIG. 1, it is illustrated that the display device 100 is a tablet (or a medium-sized mobile device).

The display device 100 may include a display area 100A and a peripheral area 100N. The peripheral area 100N may enclose the display area 100A, and in some embodiments, the peripheral area 100N may be omitted.

The display device 100 may display an image through the display area 100A. The display area 100A may include a plane (e.g., a planar surface) defined by the first direction DR1 and the second direction DR2. The display area 100A may further include curved surfaces each bent from at least two sides of the plane. However, the shape of the display area 100A is not limited thereto. For example, the display area 100A may include only the plane, and the display area 100A may further include at least two or more, for example, four curved surfaces each bent from four sides of the plane.

The thickness direction of the display device 100 may be parallel to the third direction DR3 intersecting the first direction DR1 and the second direction DR2. Accordingly, the front (or upper) and rear (or lower) surfaces of the members constituting the display device 100 may be defined with respect to the third direction DR3.

Figure 2A:
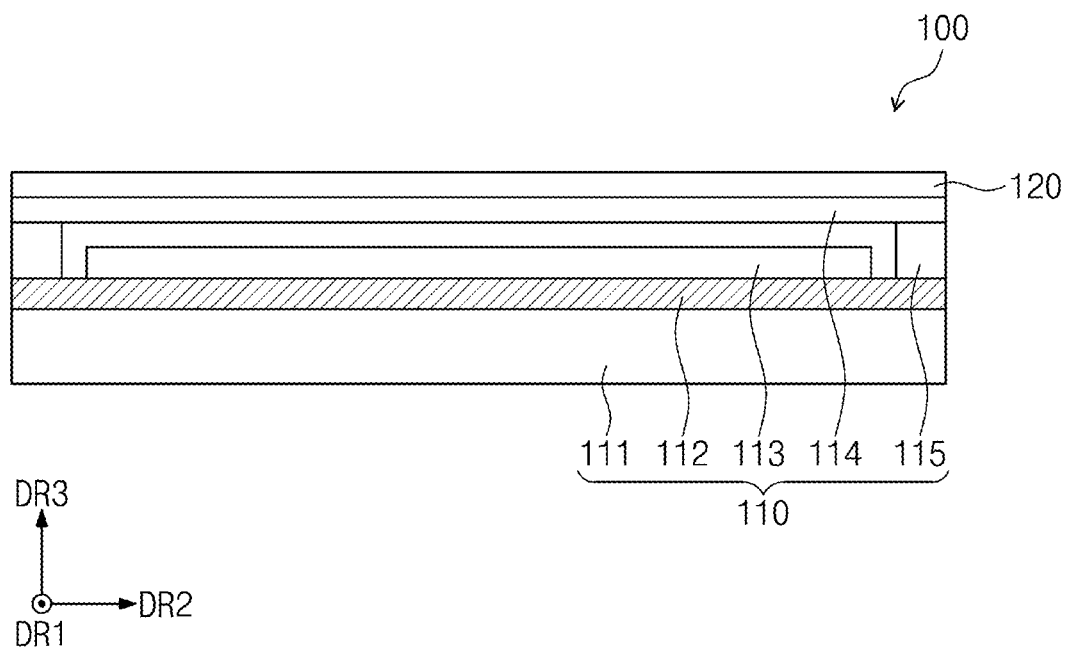
FIG. 2A is a schematic cross-sectional view of a display device according to one or more embodiments of the present disclosure.

FIG. 2A is a schematic cross-sectional view of a display device according to one or more embodiments of the present disclosure.

Referring to FIG. 2A, the display device 100 may include a display panel 110 (or a display layer) and a sensor layer 120.

The display panel 110 may be a component that substantially generates an image. The display panel 110 may be a light emitting display layer, and for example, the display panel 110 may be an organic light emitting display layer, a quantum dot display layer, and/or a micro LED display layer.

The display panel 110 may include a base substrate 111, a circuit layer 112, a light emitting element layer 113, a sealing substrate 114, and a coupling member 115.

The base substrate 111 may provide a base surface on which the circuit layer 112 is positioned. The base substrate 111 may be a glass substrate, a metal substrate, and/or a polymer substrate, but is not particularly limited thereto.

The circuit layer 112 may be on the base substrate 111. The circuit layer 112 may include an insulating layer, a semiconductor pattern, a conductive pattern, and a signal line. Here, an insulating layer, a semiconductor layer, and a conductive layer may first be formed on the base substrate 111 by a method such as coating and/or deposition, and thereafter, the formed insulating layer, semiconductor layer, and conductive layer may be selectively patterned through a plurality of photolithography processes. After that, a semiconductor pattern, a conductive pattern, and a signal line included in the circuit layer 112 may be formed.

The light emitting element layer 113 may be on the circuit layer 112. The light emitting element layer 113 may include a light emitting element. For example, the light emitting element layer 113 may include an organic light emitting material, a quantum dot, a quantum rod, and/or a micro LED.

The sealing substrate 114 may be on the light emitting element layer 113. The sealing substrate 114 may protect the light emitting element layer 113 from foreign substances such as moisture, oxygen, and/or dust particles.

The coupling member 115 may be between the base substrate 111 and the sealing substrate 114. The coupling member 115 may couple the sealing substrate 114 to the base substrate 111 or the circuit layer 112. The coupling member 115 may include an inorganic material or an organic material. For example, the inorganic material may include a frit seal, and the organic material may include a photocurable resin and/or a photoplastic resin. However, the material constituting the coupling member 115 is not limited to the above examples.

The sensor layer 120 may be on the display panel 110. The sensor layer 120 may detect an external input applied from the outside. The external input may be a user's input. The user's input may include various suitable types of external inputs such as a part of the user's body, light, heat, pen, and/or pressure.

The sensor layer 120 may be directly on the sealing substrate 114. "Directly disposed" may mean that a third component is not present between the sensor layer 120 and the display panel 110. For example, a separate adhesive member may not be provided between the sensor layer 120 and the display panel 110. However, the present disclosure is not limited thereto, and an adhesive layer may be further positioned between the sensor layer 120 and the sealing substrate 114.

Figure 2B:
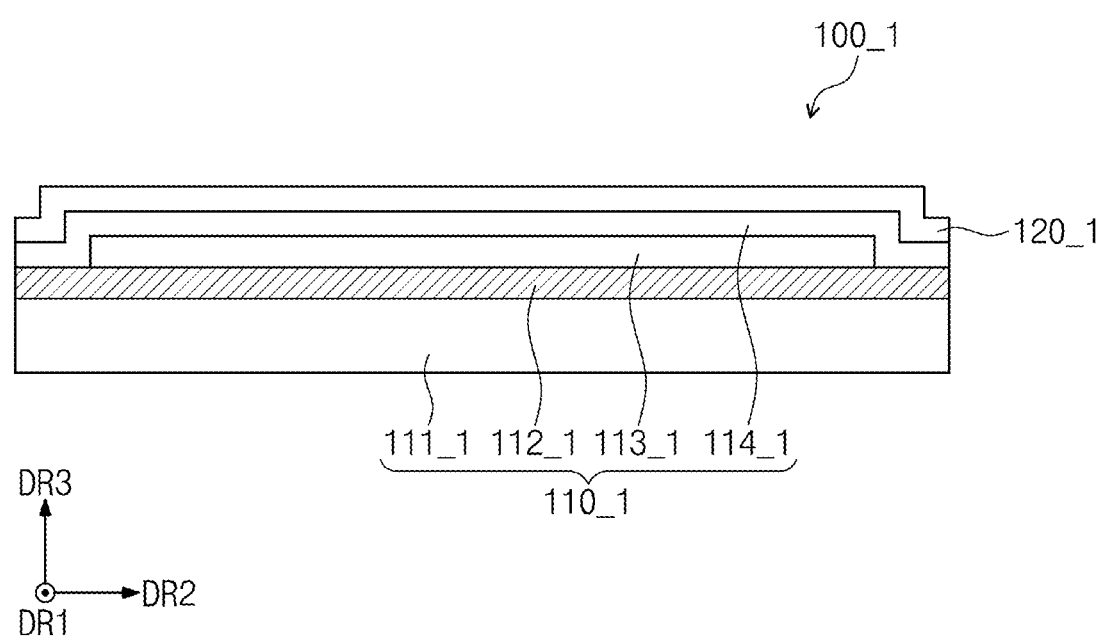
FIG. 2B is a schematic cross-sectional view of a display device according to one or more embodiments of the present disclosure.

FIG. 2B is a schematic cross-sectional view of a display device according to one or more embodiments of the present disclosure.

Referring to FIG. 2B, the display device 100_1 may include a display panel 110_1 (or a display layer) and a sensor layer 120_1. The display panel 110_1 may include a base layer 111_1, a circuit layer 112_1, a light emitting element layer 113_1, and a sealing layer 114_1.

The base layer 111_1 may provide a base surface on which the circuit layer 112_1 is positioned. The base layer 111_1 may be a glass substrate, a metal substrate, and/or a polymer substrate. However, the embodiments are not limited thereto, and the base layer 111_1 may be an inorganic layer, an organic layer, or a composite material layer.

The base layer 111_1 may have a multilayer structure. For example, the base layer 111_1 may include a first synthetic resin layer, a silicon oxide (SiOx) layer on the first synthetic resin layer, an amorphous silicon (a-Si) layer on the silicon oxide layer, and a second synthetic resin layer on the amorphous silicon layer. The silicon oxide layer and the amorphous silicon layer may be referred to as a base barrier layer.

Each of the first and second synthetic resin layers may include a polyimide resin. In one or more embodiments, each of the first and second synthetic resin layers may include at least one of acrylic resin, methacrylate resin, polyisoprene resin, vinyl resin, epoxy resin, urethane resin, cellulose resin, siloxane resin, polyamide resin, or perylene resin. As used herein, in the present specification "~~" resin or "~~"-based resin may refer to a resin including a functional group of "~~".

The circuit layer 112_1 may be on the base layer 111_1. The light emitting element layer 113_1 may be on the circuit layer 112_1. The light emitting element layer 113_1 may include a light emitting element. For example, the light emitting element layer 113_1 may include an organic light emitting material, a quantum dot, a quantum rod, and/or a micro LED.

The sealing layer 114_1 may be on the light emitting element layer 113_1. The sealing layer 114_1 may include an inorganic layer and an organic layer. The inorganic layer may protect the light emitting element layer 113_1 from moisture and/or oxygen, and the organic layer may protect the light emitting element layer 113_1 from foreign substances such as dust particles. The inorganic layer may include a silicon nitride layer, a silicon oxynitride layer, a silicon oxide layer, a titanium oxide layer, an aluminum oxide layer, and/or the like, but is not limited thereto. The organic layer may include an acrylic organic layer, but is not limited thereto.

The sensor layer 120_1 may be formed on the display panel 110_1 through a continuous process. For example, a separate adhesive member may not be provided between the sensor layer 120_1 and the display panel 110_1.

Figure 3A:
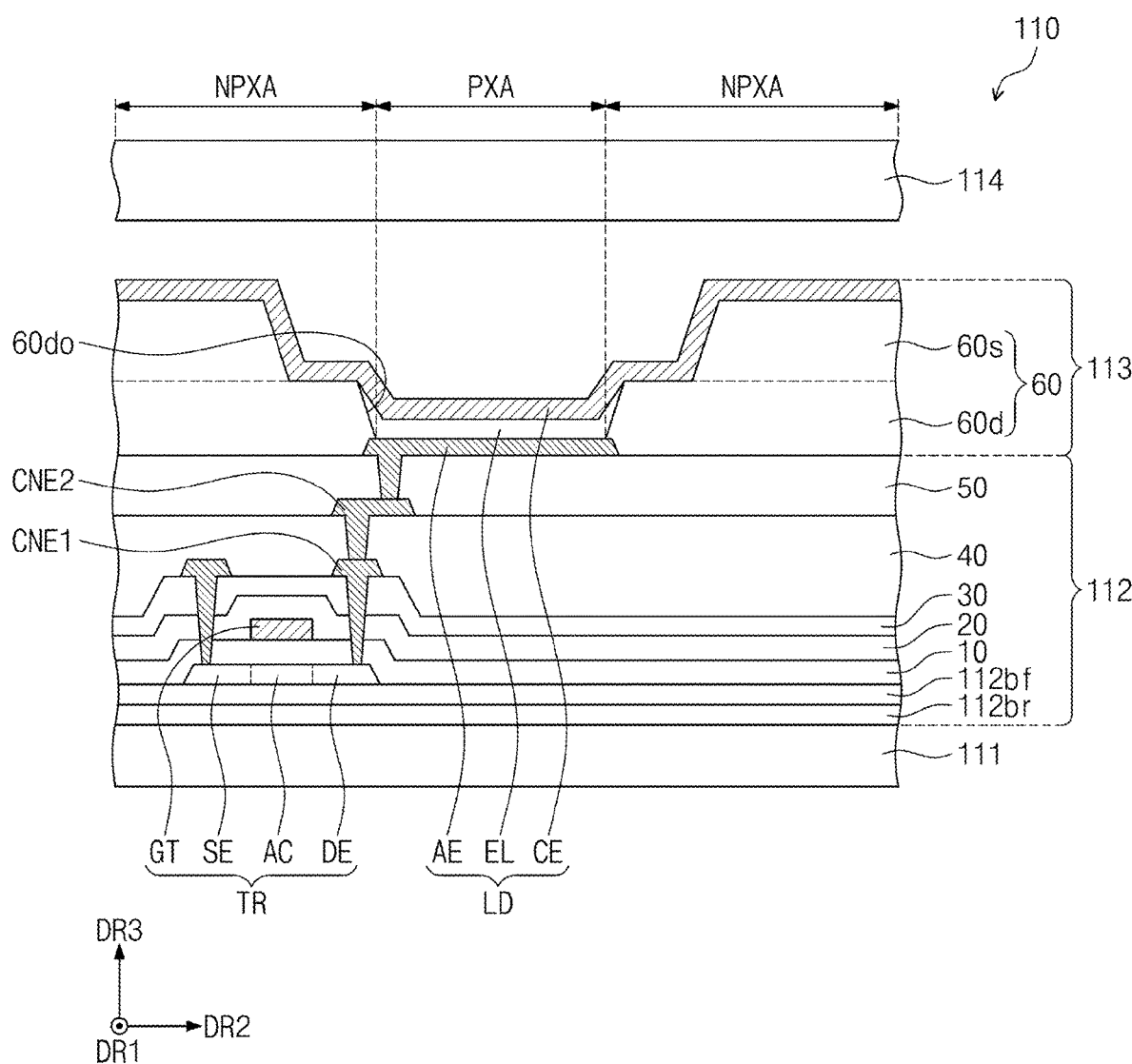
FIG. 3A is a cross-sectional view of a display panel according to one or more embodiments of the present disclosure.

FIG. 3A is a cross-sectional view of a display panel according to one or more embodiments of the present disclosure.

Referring to FIG. 3A, the display panel 110 may include a plurality of insulating layers, a semiconductor pattern, a conductive pattern, and a signal line. Here, an insulating layer, a semiconductor layer, and a conductive layer may first be formed by a method such as coating and/or vapor deposition. Thereafter, the insulating layer, the semiconductor layer, and the conductive layer may be selectively patterned by a photolithography method. In this way, semiconductor patterns, conductive patterns, and signal lines included in the circuit layer 112 and the light emitting element layer 113 of the display panel 110 are formed. Thereafter, a sealing substrate 114 covering the light emitting element layer 113 may be formed.

At least one inorganic layer is formed on the upper surface of the base substrate 111. The inorganic layer may include at least one of aluminum oxide, titanium oxide, silicon oxide, silicon oxynitride, zirconium oxide, or hafnium oxide. The inorganic layer may be formed in multiple layers. The multi-layered inorganic layers may constitute a barrier layer 112br and/or a buffer layer 112bf.

The barrier layer 112br may be on the base substrate 111. The barrier layer 112br may include any one of silicon oxide, silicon nitride, and/or silicon oxynitride. The buffer layer 112bf may be on the barrier layer 112br. The buffer layer 112bf may improve bonding force between the base substrate 111 and the semiconductor pattern. The buffer layer 112bf may include at least one of silicon oxide, silicon nitride, or silicon oxynitride. For example, the buffer layer 112bf may include alternately stacked silicon oxide and silicon nitride layers.

The semiconductor pattern may be on the buffer layer 112bf. The semiconductor pattern may include polysilicon. However, the present disclosure is not limited thereto, and the semiconductor pattern may include an amorphous silicon and/or an oxide semiconductor.

FIG. 3A illustrates only some semiconductor patterns, and semiconductor patterns may be further provided in other areas. The semiconductor pattern may be arranged in a specific (or set) rule across the pixels. Semiconductor patterns may have different electrical properties depending on whether they are doped or not. The semiconductor pattern may include a first area having high conductivity and a second area having low conductivity. The first area may be doped with an N-type dopant or a P-type dopant (e.g., may include a P-type transistor or an N-type transistor). The P-type transistor may include a doping area doped with a P-type dopant, and the N-type transistor may include a doping area doped with an N-type dopant. The second area may be a non-doping area, or an area doped with a lower concentration of the dopant than the first area.

The conductivity of the first area is greater than that of the second area, and the first area may substantially serve as an electrode or a signal line. The second area may substantially correspond to the active (or channel) region of the transistor. For example, a part of the semiconductor pattern may be an active region of the transistor, another part may be a source or drain of the transistor, and another part may be a connection electrode or a connection signal line.

The pixel may include a plurality of transistors, a capacitor, and a light emitting element LD. In FIG. 3A, one transistor TR and a light emitting element LD included in a pixel are illustrated as an example.

The source SE, the active region AC, and the drain DE of the transistor TR may be formed from the semiconductor pattern. The source SE and the drain DE may extend in opposite directions from the active region AC in a cross sectional view.

A first insulating layer 10 may be on the buffer layer 112bf. The first insulating layer 10 may overlap a plurality of pixels in common and cover the semiconductor pattern. The first insulating layer 10 may be an inorganic layer and/or an organic layer, and may have a single layer or multilayer structure. The first insulating layer 10 may include at least one of aluminum oxide, titanium oxide, silicon oxide silicon oxynitride, zirconium oxide, or hafnium oxide. For example, the first insulating layer 10 may be a single-layer silicon oxide layer. In addition to the first insulating layer 10, an insulating layer of the circuit layer 112 (to be described hereinbelow) may be an inorganic layer and/or an organic layer, and may have a single layer or multilayer structure. The inorganic layer may include at least one of the above-mentioned materials, but is not limited thereto.

The gate GT of the transistor TR is on the first insulating layer 10. The gate GT may be a part of a metal pattern. The gate GT overlaps the active region AC. In the process of doping the semiconductor pattern, the gate GT may function as a mask.

A second insulating layer 20 is on the first insulating layer 10 and may cover the gate GT. The second insulating layer 20 may be an inorganic layer and/or an organic layer, and may have a single layer or multilayer structure. For example, the second insulating layer 20 may include at least one of a silicon oxide layer, a silicon nitride layer, or a silicon oxynitride layer.

A third insulating layer 30 may be on the second insulating layer 20. The third insulating layer 30 may have a multilayer structure. For example, the third insulating layer 30 may include at least one of a silicon oxide layer, a silicon nitride layer, or a silicon oxynitride layer. A first connection electrode CNE1 may be on the third insulating layer 30. The first connection electrode CNE1 may be connected to the drain DE of the transistor TR through a contact hole penetrating the first, second, and third insulating layers 10, 20, and 30.

A fourth insulating layer 40 may be on the third insulating layer 30. The fourth insulating layer 40 may be an organic layer.

A second connection electrode CNE2 may be on the fourth insulating layer 40. The second connection electrode CNE2 may be connected to the first connection electrode CNE1 through a contact hole penetrating the fourth insulating layer 40.

A fifth insulating layer 50 is on the fourth insulating layer 40 and may cover the second connection electrode CNE2. The fifth insulating layer 50 may be an organic layer.

The light emitting element layer 113 including the light emitting element LD may be on the circuit layer 112. The light emitting element LD may include a pixel electrode AE (or an anode electrode or a first electrode), a light emitting layer EL, and a common electrode CE (or a second electrode).

The pixel electrode AE may be on the fifth insulating layer 50. The pixel electrode AE may be connected to the second connection electrode CNE2 through a contact hole penetrating the fifth insulating layer 50.

A sixth insulating layer 60 is on the fifth insulating layer 50 and may cover a part of the pixel electrode AE. An opening 60do is defined in the sixth insulating layer 60. The opening 60do of the sixth insulating layer 60 exposes at least a part of the pixel electrode AE. The opening 60do of the sixth insulating layer 60 may define an emission area PXA. A non-emission area NPXA may surround the emission area PXA.

The sixth insulating layer 60 may include a pixel defining film 60d and a spacer 60s. The spacer 60s may be a protruding portion more (e.g., higher) than the pixel defining film 60d. The opening 60do may be defined in the pixel defining film 60d. The pixel defining film 60d and the spacer 60s may be simultaneously (e.g., concurrently) formed by one mask. The mask may be a halftone mask.

The light emitting layer EL may be on the pixel electrode AE. The light emitting layer EL may be in an area corresponding to the opening 60do. For example, the light emitting layer EL may be formed separately on each of the pixels. In one or more embodiments of the present disclosure, a first color light emitting layer is provided by being connected to some of the plurality of pixels among the plurality of pixels, and a second color light emitting layer and a third color light emitting layer may be separately provided to each of the pixels. The first color may be blue, the second color may be red, and the third color may be green, but this is not particularly limited.

The common electrode CE may be on the light emitting layer EL. The common electrode CE has an integral shape and may be commonly provided on a plurality of pixels.

In one or more embodiments, a hole control layer may be between the pixel electrode AE and the light emitting layer EL. The hole control layer may include a hole transport layer and may further include a hole injection layer. An electron control layer may be between the light emitting layer EL and the common electrode CE. The electron control layer may include an electron transport layer, and may further include an electron injection layer. The hole control layer and the electron control layer may be commonly formed in a plurality of pixels using an open mask.

The sealing substrate 114 may be on the light emitting element layer 113.

Figure 3B:
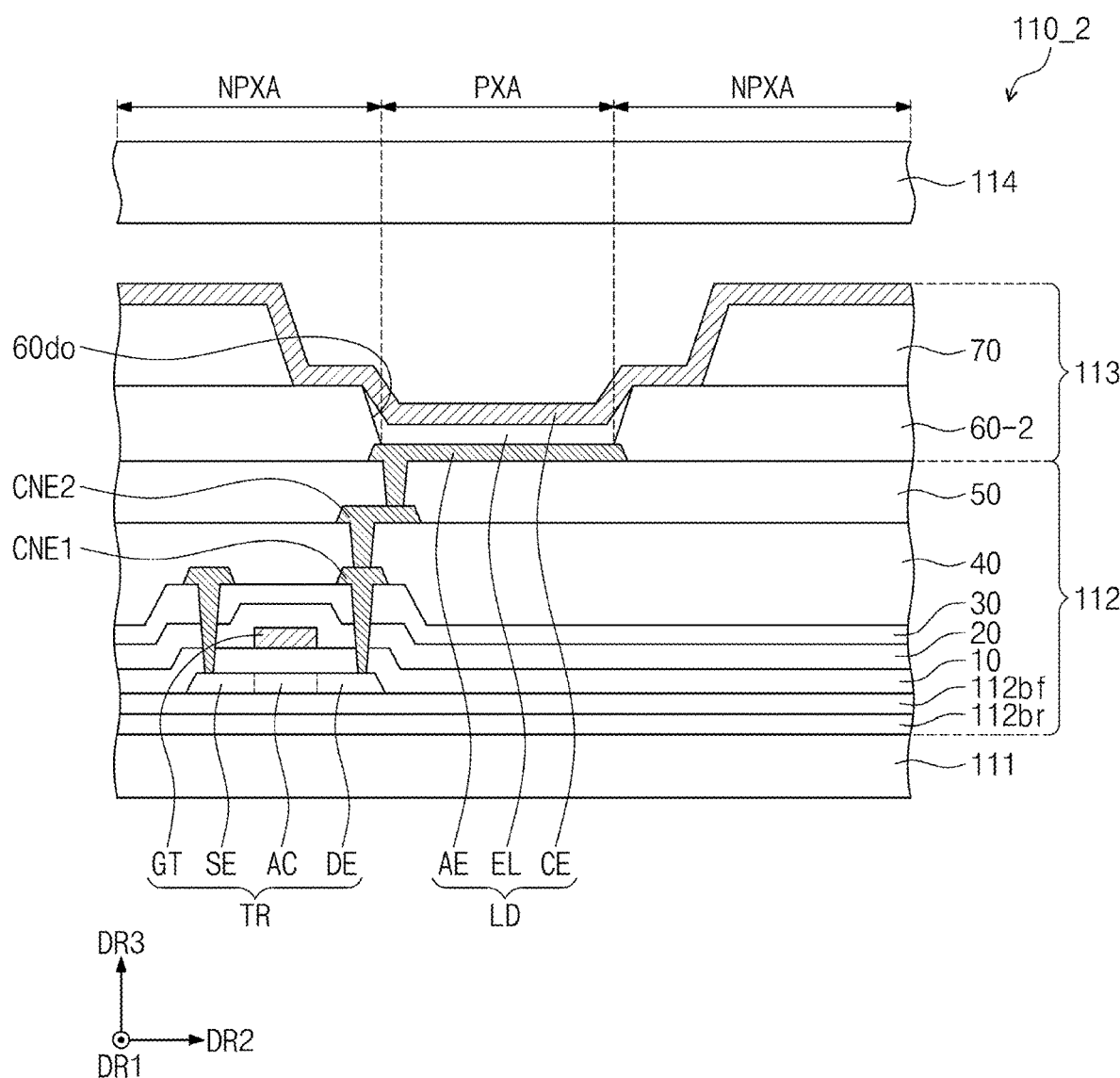
FIG. 3B is a cross-sectional view of a display panel according to one or more embodiments of the present disclosure.

FIG. 3B is a cross-sectional view of a display panel according to one or more embodiments of the present disclosure. In the description of FIG. 3B, the same (or substantially similar) reference numerals are used for the same (or substantially similar) components as those described in FIG. 3A, and redundant descriptions thereof are not provided.

Referring to FIG. 3B, a pixel defining film 60-2 and a spacer 70 of a display panel 110_2 are different from the pixel defining layer and the spacer in the sixth insulating layer 60 of FIG. 3A.

The pixel defining film 60-2 is on the fifth insulating layer 50 and may cover a portion of the pixel electrode AE. In the pixel defining film 60-2, an opening 60do is defined. The opening 60do of the pixel defining film 60-2 exposes at least a part of the pixel electrode AE. The opening 60do of the pixel defining film 60-2 may define the emission area PXA. The non-emission area NPXA may surround the emission area PXA.

The spacer 70 may be on the pixel defining film 60-2. The spacer 70 may be formed through a process separate from the formation of the pixel defining film 60-2.

Figure 4:
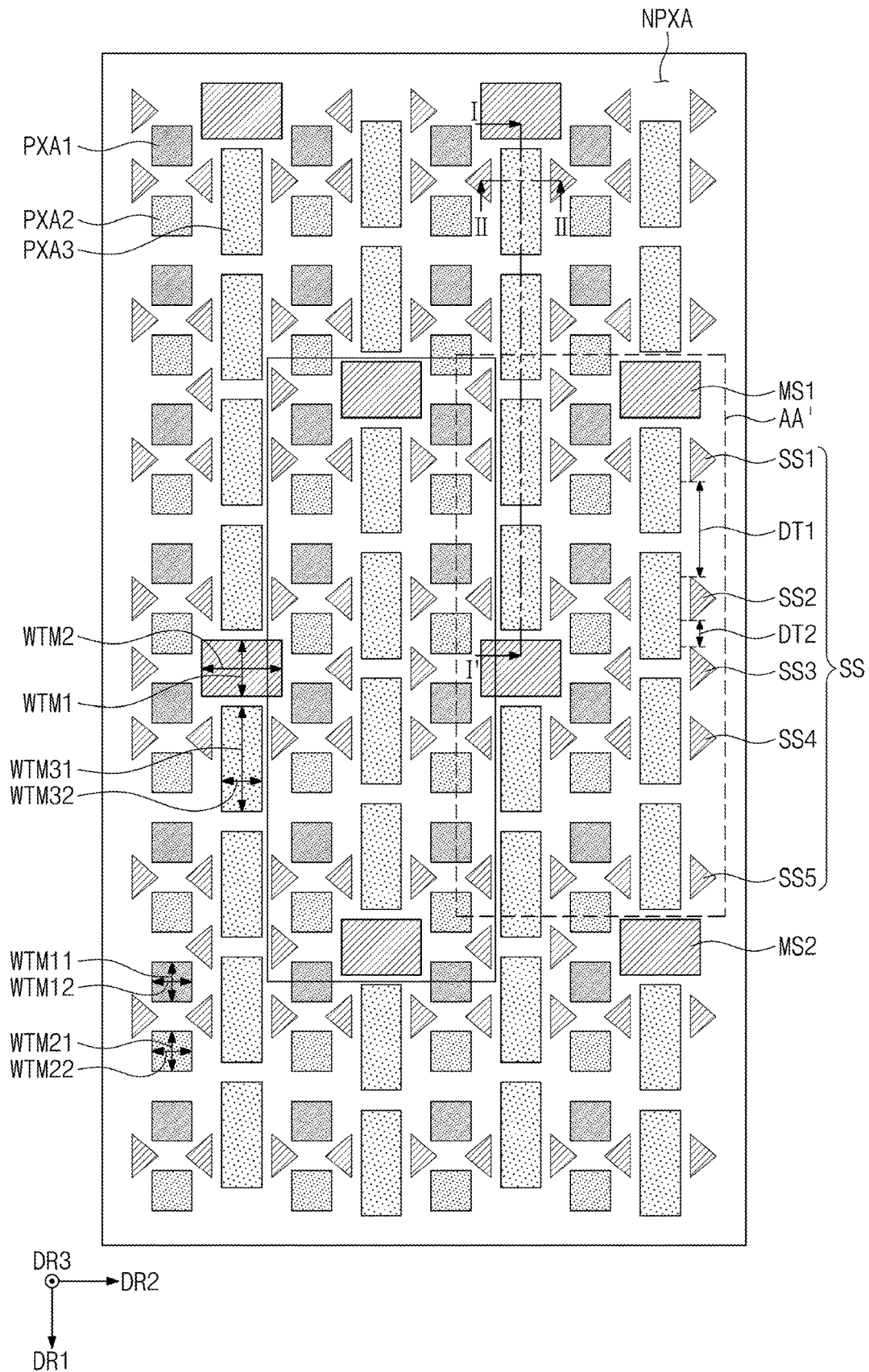
FIG. 4 is a plan view illustrating a partial configuration of a display panel according to one or more embodiments of the present disclosure.

FIG. 4 is a plan view illustrating a partial configuration of a display panel according to one or more embodiments of the present disclosure.

Referring to FIG. 4, a plurality of first emission areas PXA1 (hereinafter referred to as first emission areas PXA1) defined in the display panel 110 (see FIG. 3A), a plurality of second emission areas PXA2 (hereinafter referred to as second emission areas PXA2), and a plurality of third emission areas PXA3 (hereinafter referred to as third emission areas PXA3) are illustrated. Each of the first to third emission areas PXA1, PXA2, and PXA3 may correspond to the emission area PXA (see FIG. 3A) described with reference to FIG. 3A.

The first emission areas PXA1 and the second emission areas PXA2 may be alternately arranged one by one. For example, one first emission area PXA1 and one second emission area PXA2 may be alternately arranged along the first direction DR1.

The third emission areas PXA3 may be arranged along the first direction DR1. One third emission area PXA3 may overlap one first emission area PXA1 and one second emission area PXA2 in a second direction DR2.

An area of each of the third emission areas PXA3 may be larger than an area of each of the first emission areas PXA1 and an area of each of the second emission areas PXA2. The areas may mean an area when viewed from a plane in a thickness direction of the display panel 110 (refer to FIG. 3A) or in a direction parallel to the third direction DR3.

One of the first emission areas PXA1 and the second emission areas PXA2 may be red emission areas, and the other may be green emission areas. The third emission areas PXA3 may be blue emission areas. By providing a large area of the third emission areas PXA3 including a blue light emitting layer having a relatively short lifespan, the lifespan of the display device 100 may be improved.

A first spacer MS1, a second spacer MS2, and a plurality of protruding portions SS (hereinafter, protruding portions SS) may be in the non-emission area NPXA. The protruding portions SS may be referred to as sub-spacers, additional spacers, and/or supports.

The first spacer MS1 may be between the third emission areas PXA3. For example, the first spacer MS1 may be to be spaced apart from one of the third emission areas PXA3 in the first direction DR1. The second spacer MS2 may be a spacer closest to the first spacer MS1 in the first direction DR1.

m number of third emission areas PXA3 may be between the first spacer MS1 and the second spacer MS2. m is an integer of 4 or more, and may be 4. When compared to the case where spacers are between the third emission areas PXA3, in one or more embodiments of the present disclosure, areas occupied by the first spacer MS1 and the second spacer MS2 may be reduced. For example, as the area occupied by the first and second spacers MS1 and MS2 decreases, an area of each of the third emission areas PXA3 may increase. When the area of each of the third emission areas PXA3 increases, the lifespan of each of the third emission areas PXA3 may be improved.

The first spacer MS1 may have a first width WTM1 in the first direction DR1 and a second width WTM2 in the second direction DR2. The first width WTM1 may be greater than each of a first width WTM11 in the first direction DR1 of the first emission area PXA1 and a first width WTM21 in the first direction DR1 of the second emission area PXA2. The first width WTM1 of the first spacer MS1 may be smaller than a first width WTM31 in the first direction DR1 of the third emission area PXA3.

The second width WTM2 may be greater than each of a second width WTM12 in the second direction DR2 of the first emission area PXA1 and a second width WTM22 in the second direction DR2 of the second emission area PXA2. The second width WTM2 may be larger than a second width WTM32 in the second direction DR2 of the third emission area PXA3, but is not particularly limited thereto, and the second width WTM2 may be the same as the second width WTM32 of the third emission area PXA3 or may be smaller than the second width WTM32.

The protruding portions SS may be spaced apart from the third emission areas PXA3 in the second direction DR2. The protruding portions SS may be between the first spacer MS1 and the second spacer MS2. The protruding portions SS may be arranged to be spaced apart along the first direction DR1.

The shape of each of the protruding portions SS may be different from the shape of the first spacer MS1. For example, the first spacer MS1 may have a square shape. The shapes of the protruding portions SS may be substantially the same as each other. For example, the shape of each of the protruding portions SS may be a triangle. The area of each of the protruding portions SS may be smaller than the area of the first spacer MS1. The area may mean an area as viewed from the third direction DR3.

The protruding portions SS may include a first protruding portion SS1, a second protruding portion SS2, a third protruding portion SS3, a fourth protruding portion SS4, and a fifth protruding portion SS5. The first to fifth protruding portions SS1, SS2, SS3, SS4, and SS5 may be arranged to be spaced apart from each other along the first direction DR1.

The first protruding portion SS1 may be closest to the first spacer MS1 among the first to fifth protruding portions SS1, SS2, SS3, SS4, and SS5, and the third protruding portion SS3 may be spaced farthest from both the first and second spacers MS1 and MS2 among the first to fifth protruding portions SS1, SS2, SS3, SS4, and SS5. The interval DT1 between the first protruding portion SS1 and the second protruding portion SS2 may be greater than the interval DT2 between the second protruding portion SS2 and the third protruding portion SS3. The first protruding portion SS1 and the second protruding portion SS2 are adjacent protruding portions among the first to fifth protruding portions SS1, SS2, SS3, SS4, and SS5 in a region near the first spacer MS1. The second protruding portion SS2 and the third protruding portion SS3 are adjacent protruding portions among the first to fifth protruding portions SS1, SS2, SS3, SS4, and SS5 in a central region between the first spacer MS1 and the second spacer MS2.

The third protruding portion SS3 may be adjacent to one spacer arranged in another column in the second direction DR2. For example, the four third emission areas PXA3 arranged in the first direction DR1 between the first and second spacers MS1 and MS2 arranged in the n-th column may be arranged in zigzag (e.g., checkered arrangement) with four third emission areas PXA3 arranged in a first direction DR1 between the first and second spacers MS1 and MS2 in each of the (n−1)-th column and the (n+1)-th column. For example, a substantially central portion of the four third emission areas PXA3 in the (n−1)-th column may overlap the first spacer MS1 in the n-th column in the second direction DR2.

According to one or more embodiments of the present disclosure, the protruding portions may be more densely positioned in a region most spaced apart from both the first spacer MS1 and the second spacer MS2 than in regions adjacent to the first spacer MS1 or the second spacer MS2.

According to one or more embodiments of the present disclosure, the area of the third emission area PXA3 may be increased by reducing the density or number of the first spacer MS1 and the second spacer MS2. Accordingly, the lifespan of the display panel 110 or 110_1 (refer to FIG. 2A or 2B) may be improved. In addition, the protruding portions SS may be in an area where the first spacer MS1 and the second spacer MS2 are not provided. In this case, during the process of forming the display panel 110 or 110_1 (see FIG. 2A or 2B), the probability of occurrence of imprinting on the light emitting layer EL (see FIG. 3A) by the mask may be eliminated or reduced. In addition, during the process of forming the light emitting layer, the mask is sufficiently supported, so that the probability that the light emitting layer is formed in an area other than the designed area may be eliminated or reduced. Accordingly, a failure rate of the display panel 110 or 110_1 (refer to FIG. 2A or 2B) may be reduced, and a manufacturing yield may be improved.

Figure 5:
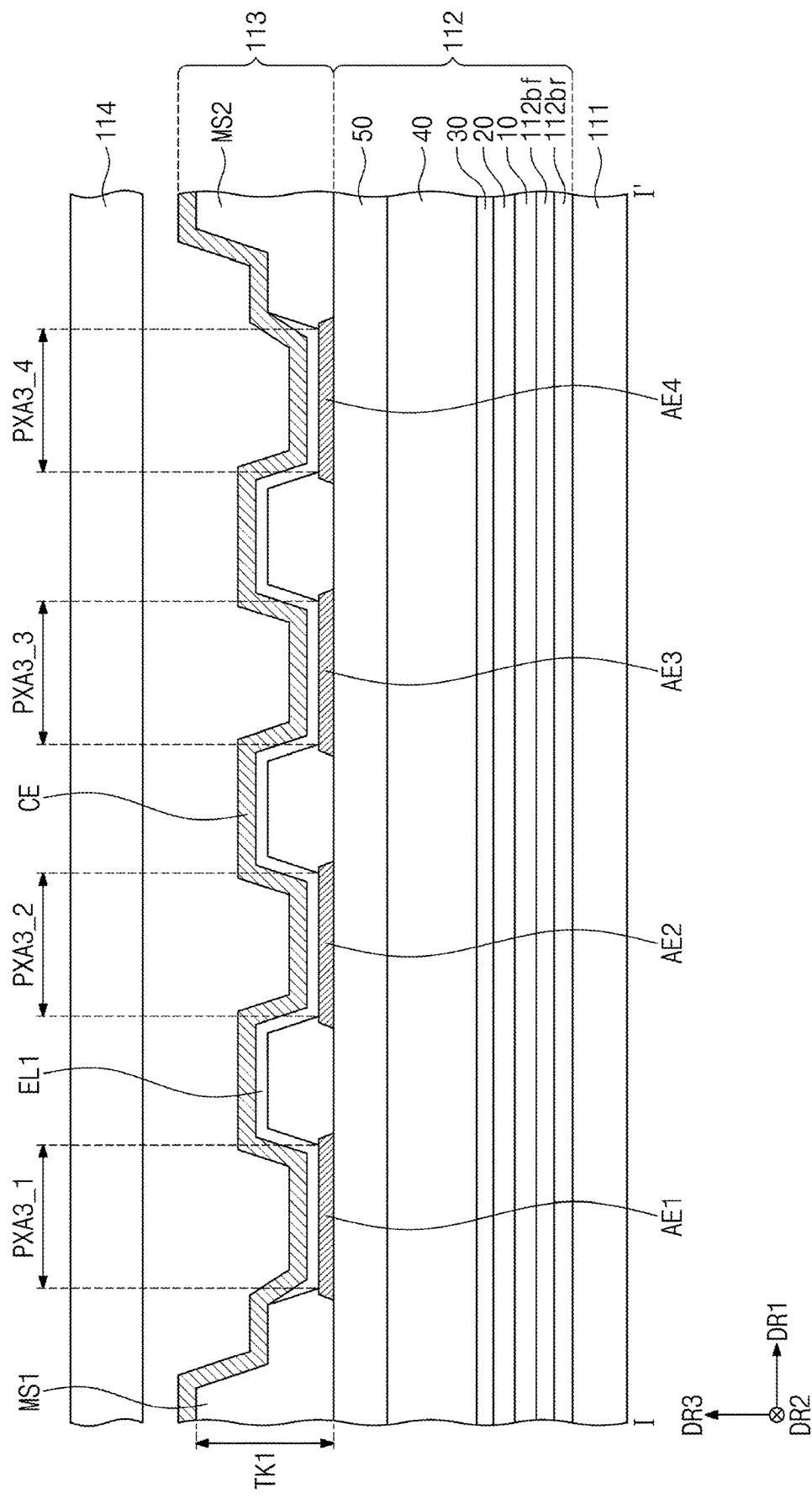
FIG. 5 is a cross-sectional view of a display panel cut through an area corresponding to I-I' of FIG. 4.
Figure 6:
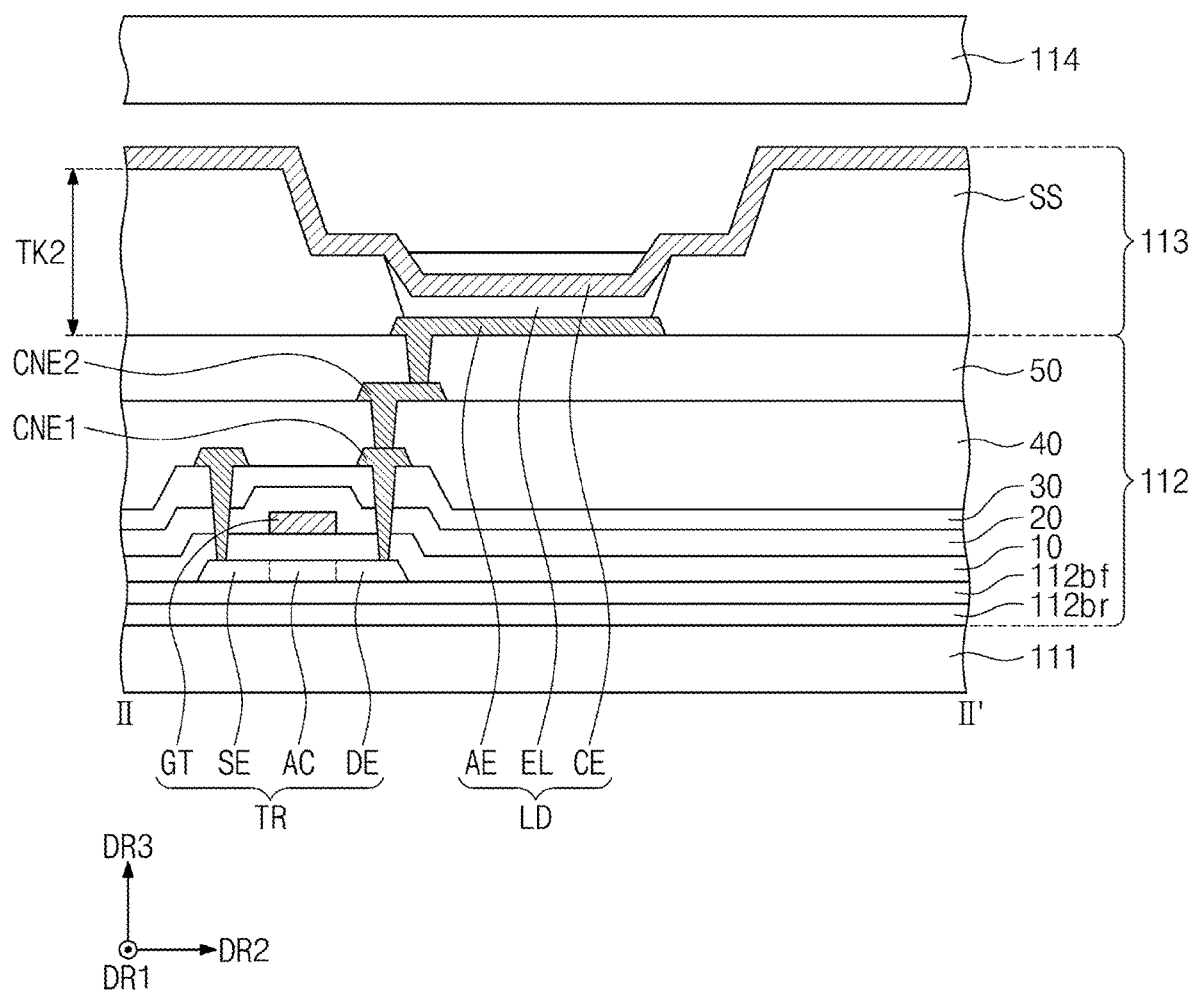
FIG. 6 is a cross-sectional view of a display panel cut through an area corresponding to II-II' of FIG. 4.

FIG. 5 is a cross-sectional view of a display panel cut through an area corresponding to I-I' of FIG. 4. FIG. 6 is a cross-sectional view of a display panel cut through an area corresponding to II-II' of FIG. 4.

Referring to FIG. 5, at least four pixel electrodes AE1, AE2, AE3, and AE4 may be between the first spacer MS1 and the second spacer MS2. Accordingly, at least four emission areas PXA3_1, PXA3_2, PXA3_3, and PXA3_4 may be defined between the first spacer MS1 and the second spacer MS2. One light emitting layer EL1 may be positioned on the four pixel electrodes AE1, AE2, AE3, and AE4. For example, at least four emission areas PXA3_1, PXA3_2, PXA3_3, and PXA3_4 may be defined in one light emitting layer EL1.

A first spacer MS1 and a second spacer MS2 are in a first direction DR1 based on one light emitting layer EL1, and the protruding portions SS (refer to FIG. 4) may be in the second direction DR2.

Referring to FIGS. 5 and 6, the sixth insulating layer 60 (see FIG. 3A) may have a first thickness TK1 at a portion overlapping the first spacer MS1, and may have a second thickness TK2 at a portion overlapping the protruding portion SS. Each of the first thickness TK1 and the second thickness TK2 may be defined as a maximum thickness within the portions.

The first thickness TK1 and the second thickness TK2 may be substantially the same as each other. "Substantially the same" may mean that they are the same to each other within a process error range. However, the present disclosure is not particularly limited thereto. The first thickness TK1 may be larger than the second thickness TK2.

Figure 7:
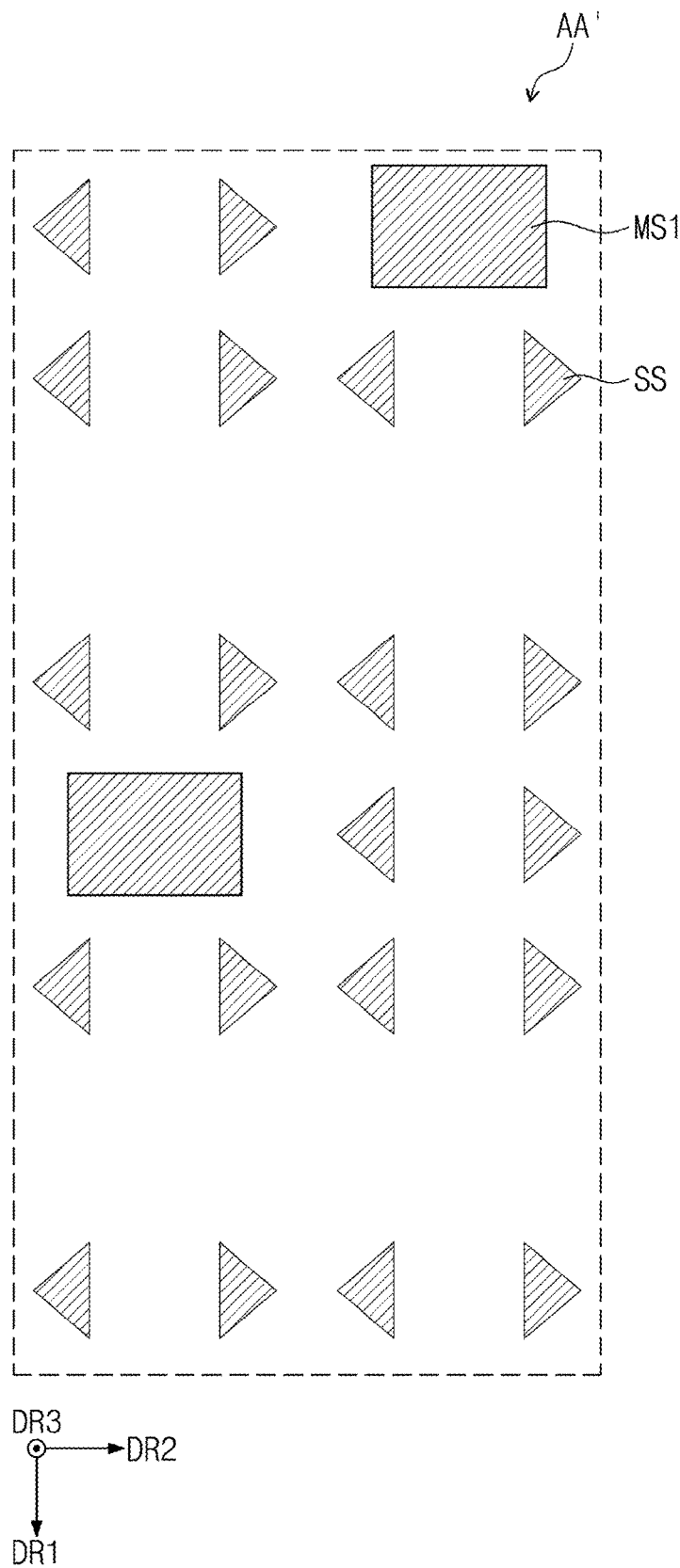
FIG. 7 is a plan view illustrating spacers and protruding portions in area AA' of FIG. 4.

FIG. 7 is a plan view illustrating spacers and protruding portions in area AA' of FIG. 4.

Referring to FIGS. 4 and 7, the AA' area is an area corresponding to an area including the first spacer MS1 and the protruding portions SS. The AA' area indicates the smallest unit of spacers that are identically repeatedly arranged in the display panel 110 (see FIG. 3A). When the spacers included in the AA' area are repeatedly arranged in the first direction DR1 and the second direction DR2, they may have the arrangement shape shown in FIG. 4. The spacers include all spacers and protruding portions included in the AA' area.

The number and/or area of the protruding portions SS may be determined so that the area ratio of the spacers to the AA' area does not exceed a predetermined (or set) value. For example, when applied to the display device 100 illustrated in FIG. 2A, the ratio may be 10%. In one or more embodiments, when applied to the display device 100_1 illustrated in FIG. 2B, the ratio may be 2%. However, the above figures are only examples and are not particularly limited thereto.

Also, the spacers may not overlap contact holes formed in the insulating layers. For example, the first spacer MS1 and the protruding portions SS may not be on the contact hole formed in the fifth insulating layer 50 illustrated in FIG. 3A. In this case, uniformity of each of the first thickness TK1 (see FIG. 5) and the second thickness TK2 (see FIG. 6) is improved, so that the manufacturing yield of the display panel 110 may be improved.

Figure 8:
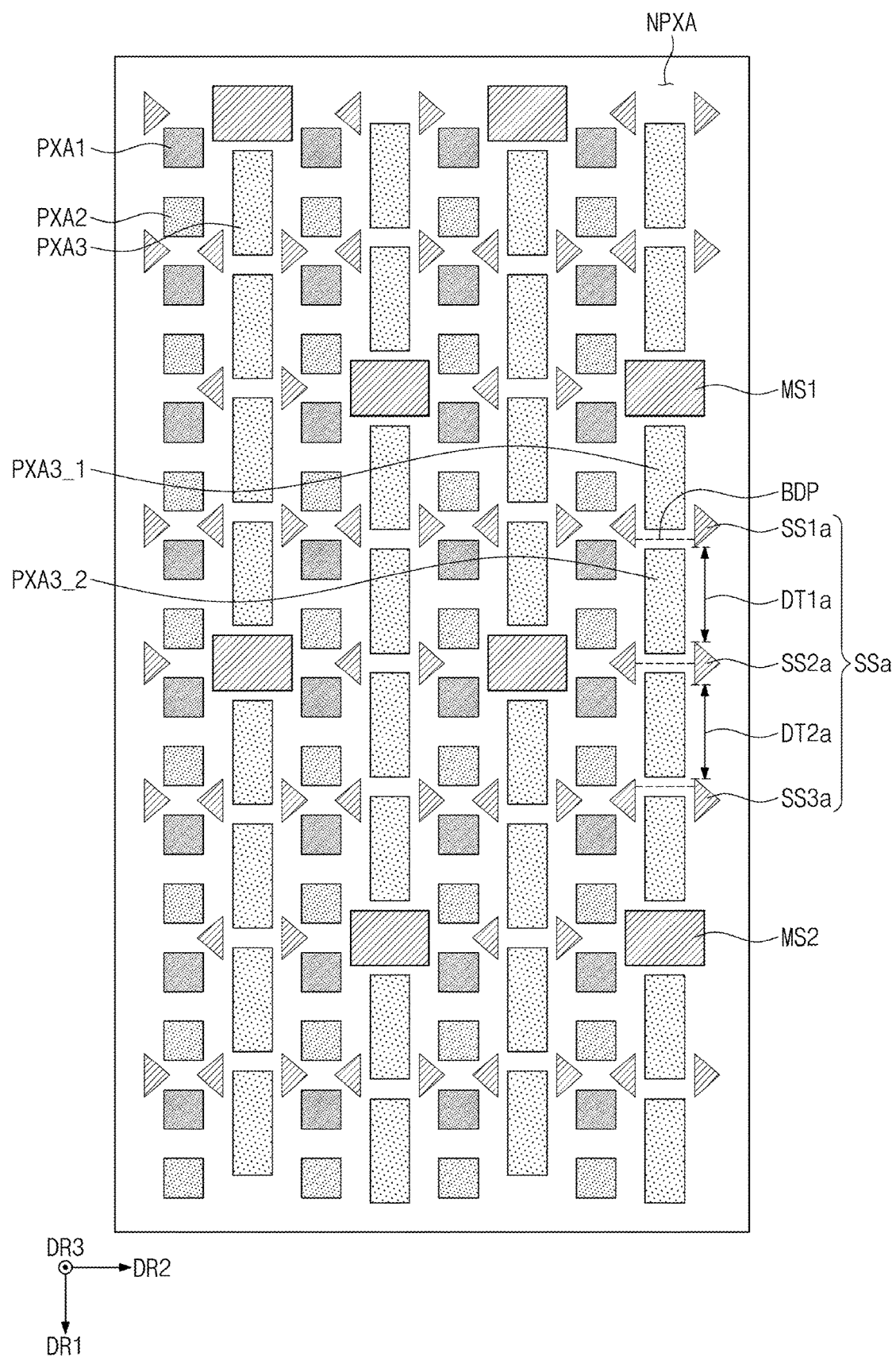
FIG. 8 is a plan view illustrating a partial configuration of a display panel according to one or more embodiments of the present disclosure.

FIG. 8 is a plan view illustrating a partial configuration of a display panel according to one or more embodiments of the present disclosure. In the description of FIG. 8, the same (or substantially similar) reference numerals are used for the same (or substantially similar) components as those described in FIG. 4, and redundant descriptions thereof are not provided.

Referring to FIG. 8, protruding portions SSa may be adjacent to boundaries BDP between the third emission areas PXA3_1 and PXA3_2 adjacent to each other among the m third emission areas PXA3 between the first spacer MS1 and the second spacer MS2.

For example, when four third emission areas PXA3 are arranged between the first spacer MS1 and the second spacer MS2, the number of the boundaries BDP is three. Accordingly, the number of protruding portions SSa arranged in the first direction DR1 may also be three. The protruding portions SSa may include a first protruding portion SSa1, a second protruding portion SSa2, and a third protruding portion SSa3.

The first to third protruding portions SSa1, SSa2, and SSa3 may be arranged at equal intervals from each other. For example, the interval DT1a between the first protruding portion SSa1 and the second protruding portion SSa2 may be the same as the interval DT2a between the second protruding portion SSa2 and the third protruding portion SSa3.

Figure 9:
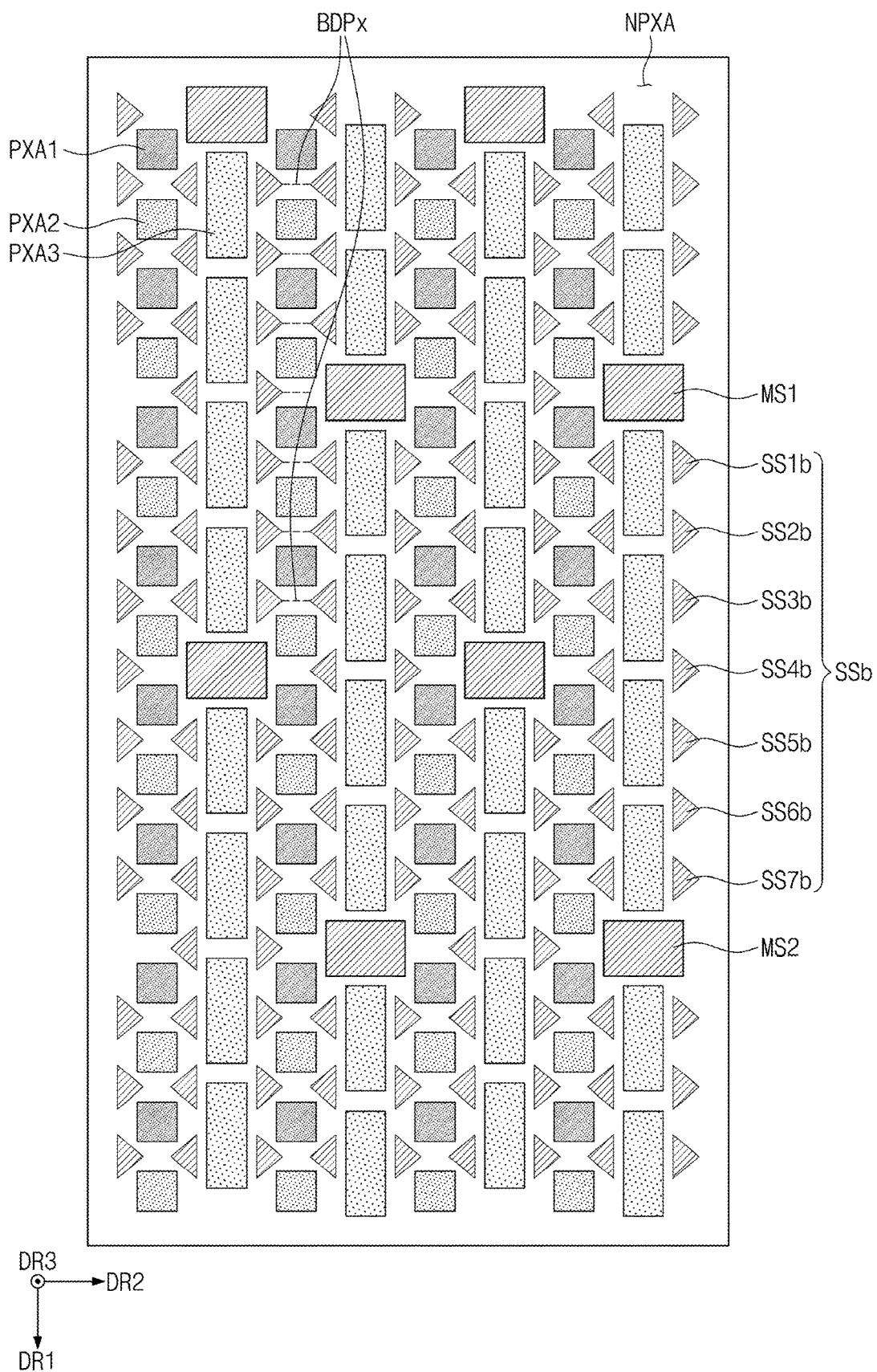
FIG. 9 is a plan view illustrating a partial configuration of a display panel according to one or more embodiments of the present disclosure.

FIG. 9 is a plan view illustrating a partial configuration of a display panel according to one or more embodiments of the present disclosure. In the description of FIG. 9, the same (or substantially similar) reference numerals are used for the same (or substantially similar) components as those described in FIG. 4, and redundant descriptions thereof are not provided.

Referring to FIG. 9, protruding portions SSb may be between the first spacer MS1 and the second spacer MS2. The protruding portions SSb may include first to seventh protruding portions SSb1, SSb2, SSb3, SSb4, SSb5, SSb6, and SSb7. The first to seventh protruding portions SSb1, SSb2, SSb3, SSb4, SSb5, SSb6, and SSb7 may be adjacent to boundaries BDPx, respectively, between the first and second emission areas PXA1 and PXA2 adjacent to the m third emission areas PXA3.

For example, when four third emission areas PXA3 are arranged between the first spacer MS1 and the second spacer MS2, the total number of the first emission areas PXA1 and the second emission areas PXA2 adjacent to the four third emission areas PXA3 in the second direction DR2 may be eight. In this case, the number of the boundaries BDPx may be seven. Accordingly, the number of protruding portions SSb arranged in the first direction DR1 may also be seven.

Figure 10:
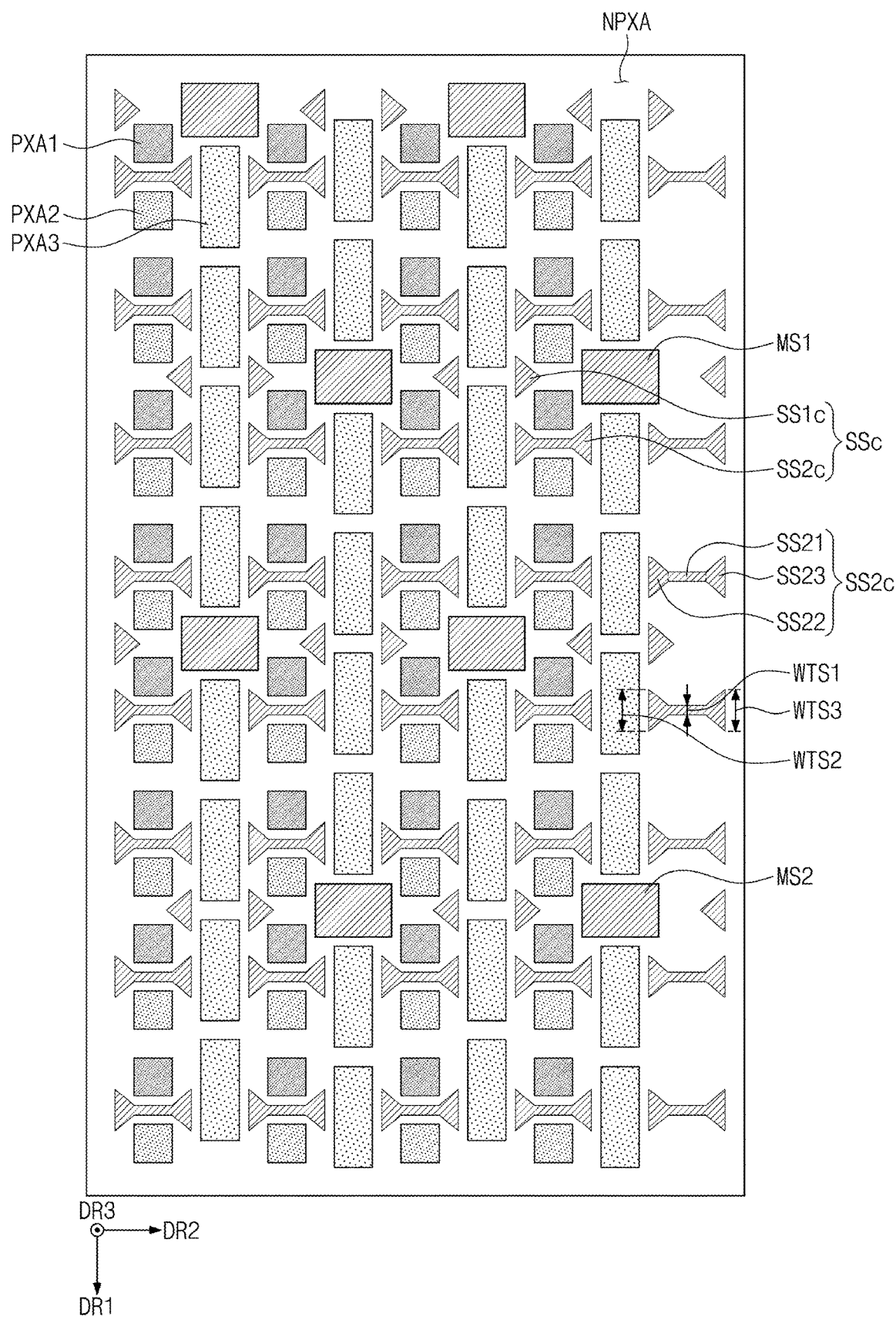
FIG. 10 is a plan view illustrating a partial configuration of a display panel according to one or more embodiments of the present disclosure.

FIG. 10 is a plan view illustrating a partial configuration of a display panel according to one or more embodiments of the present disclosure. In the description of FIG. 10, the same (or substantially similar) reference numerals are used for the same (or substantially similar) components as those described in FIG. 4, and redundant descriptions thereof are not provided.

Referring to FIG. 10, protruding portions SSc may include a first protruding portion SS1c and a second protruding portion SS2c. The first protruding portion SS1c and the second protruding portion SS2c may be divided according to their respective shape. For example, the first protruding portion SS1c may have a smaller area than the second protruding portion SS2c.

The first protruding portion SS1c may be spaced apart from the first spacer MS1 in the second direction DR2. The second protruding portion SS2c may be spaced apart from the first spacer MS1 in the first direction DR1.

The distance between one first spacer MS1 and another first spacer MS1 closest to the one first spacer MS1 in the second direction DR2 is smaller than the distance between the first spacer MS1 and the closest second spacer MS2 in the first direction DR1. Accordingly, the size of the first protruding portion SS1c spaced apart from the first spacer MS1 in the second direction DR2 may be smaller than the size of the second protruding portion SS2c.

The second protruding portion SS2c may include a first portion SS21, a second portion SS22, and a third portion SS23. The first portion SS21 may have a bar shape extending along the second direction DR2, and the first portion SS21 may be between the first emission area PXA1 and the second emission area PXA2 in the first direction DR1.

The second portion SS22 may extend from the first end of the first portion SS21, and the third portion SS23 may extend from the second end of the first portion SS21. The first end of the first portion SS21 and the second end of the first portion SS21 may be those in the second direction DR2 (e.g., in the extension direction of the first portion SS21).

The width WTS1 of the first portion SS21 in the first direction DR1 may be smaller than each of the maximum width WTS2 in the first direction DR1 of the second portion SS22 and the maximum width WTS3 in the first direction DR1 of the third portion SS23.

The second protruding portion SS2c may have a dumbbell shape or a ribbon shape when viewed from a plane. It is shown in FIG. 10 that each of the second portion SS22 and the third portion SS23 has a triangular shape, but the second portion SS22 and the third portion SS23 may be transformed into various suitable shapes such as a square and/or a circle.

Four second protruding portions SS2c and one first protruding portion SS1c may be arranged along the first direction DR1 between the first spacer MS1 and the second spacer MS2. For example, the second protruding portions SS2c may be spaced apart in the first direction DR1 and may be arranged at equal intervals. The first protruding portion SS1c may be at the middle between the first spacer MS1 and the second spacer MS2. Thus, the first spacer MS1, the two second protruding portions SS2c, the first protruding portion SS1c, the two second protruding portions SS2c, and the second spacers MS2 may be sequentially arranged along the first direction DR1.

Four second protruding portions SS2c and one first protruding portion SS1c may be arranged at both a right side and a left side (e.g., along the second direction DR2) of the four third emission areas PXA3 positioned between the first spacer MS1 and the second spacer MS2.

Figure 11:
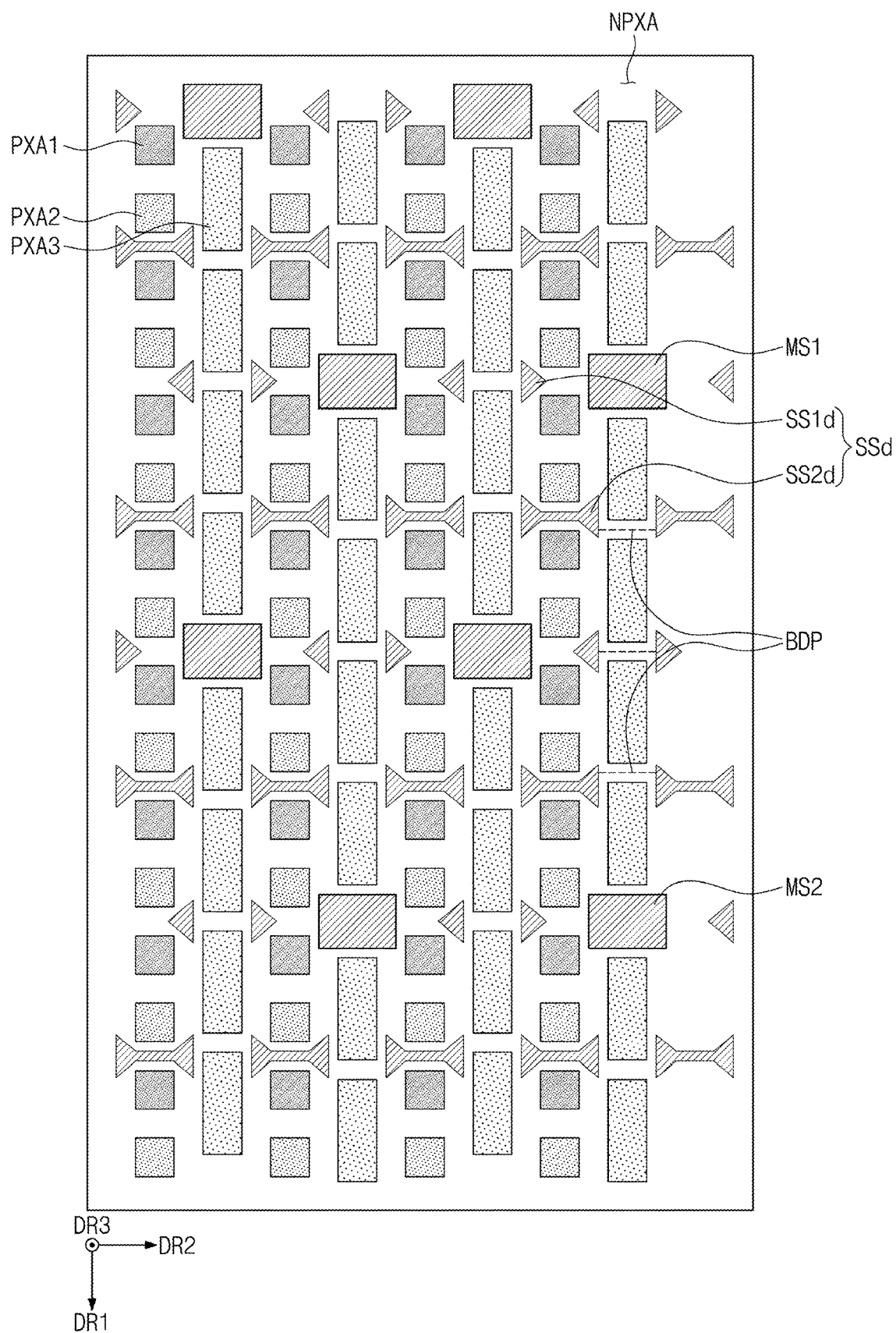
FIG. 11 is a plan view illustrating a partial configuration of a display panel according to one or more embodiments of the present disclosure.

FIG. 11 is a plan view illustrating a partial configuration of a display panel according to one or more embodiments of the present disclosure. In the description of FIG. 11, the same (or substantially similar) reference numerals are used for the same (or substantially similar) components as those described in FIG. 10, and redundant descriptions thereof are not provided.

Referring to FIG. 11, protruding portions SSd may include a first protruding portion SS1d and a second protruding portion SS2d. The first protruding portion SS1d and the second protruding portion SS2d may be divided according to their respective shape. For example, the first protruding portion SS1d may have a smaller area than the second protruding portion SS2d.

The first protruding portion SS1d may be spaced apart from the first spacer MS1 in the second direction DR2. The second protruding portion SS2d may be spaced apart from the first spacer MS1 in the first direction DR1.

Two second protruding portions SS2d and one first protruding portion SS1d may be arranged along the first direction DR1 between the first spacer MS1 and the second spacer MS2. For example, one second protruding portion SS2d, the first protruding portion SS1d, and the remaining one second protruding portion SS2d may be spaced apart in the first direction DR1 between the first spacer MS1 and the second spacer MS2 and arranged at equal intervals.

The two second protruding portions SS2d and one first protruding portion SS1d may be adjacent to the boundaries BDP between the third emission areas PXA3 adjacent to each other in the first direction DR1 among the m third emission areas PXA3 between the first spacer MS1 and the second spacer MS2.

Figure 12:
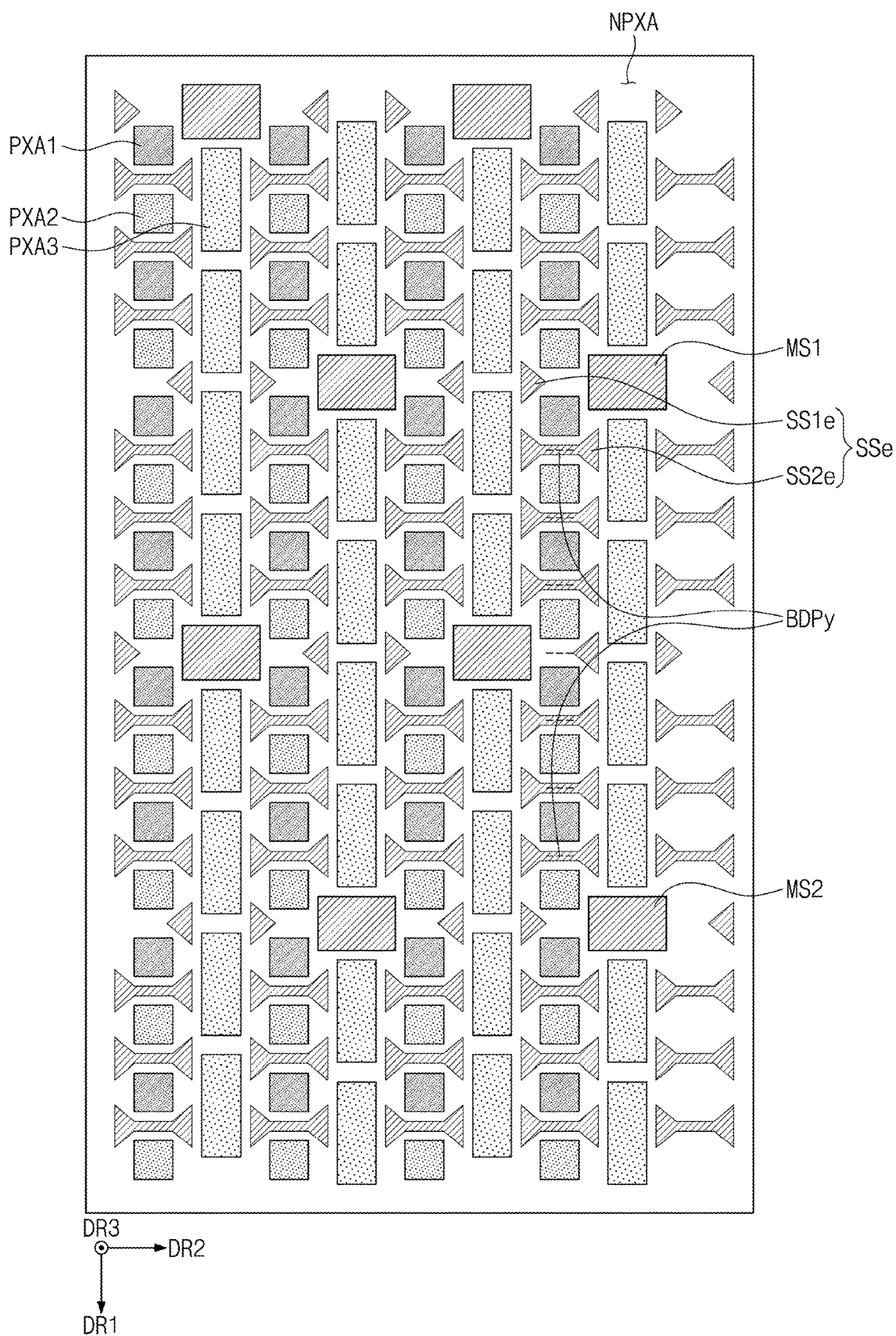
FIG. 12 is a plan view illustrating a partial configuration of a display panel according to one or more embodiments of the present disclosure.

FIG. 12 is a plan view illustrating a partial configuration of a display panel according to one or more embodiments of the present disclosure. In the description of FIG. 12, the same (or substantially similar) reference numerals are used for the same (or substantially similar) components as those described in FIG. 10, and redundant descriptions thereof are not provided.

Referring to FIG. 12, protruding portions SSe may include a first protruding portion SS1e and a second protruding portion SS2e. The first protruding portion SS1e and the second protruding portion SS2e may be divided according to their respective shape. For example, the first protruding portion SS1e may have a smaller shape than the second protruding portion SS2e.

The first protruding portion SS1e may be spaced apart from the first spacer MS1 in the second direction DR2. The second protruding portion SS2e may be spaced apart from the first spacer MS1 in the first direction DR1.

Six second protruding portions SS2e and one first protruding portion SS1e may be arranged along the first direction DR1 between the first spacer MS1 and the second spacer MS2. The six second protruding portions SS2e and one first protruding portion SS1e may be adjacent to the boundaries BDPy between the first emission areas PXA1 and the second emission areas PXA2 that are arranged in the first direction DR1 adjacent to the m third emission areas PXA3 between the first spacer MS1 and the second spacer MS2.

For example, when four third emission areas PXA3 are between the first spacer MS1 and the second spacer MS2, the total number of the first emission areas PXA1 and the second emission areas PXA2 adjacent to the four third emission areas PXA3 in the second direction DR2 may be eight. In this case, the number of the boundaries BDPy may be seven. Accordingly, the total number of the first protruding portion SS1e and the second protruding portion SS2e arranged in the first direction DR1 may also be seven.

The three second protruding portions SS2e, the first protruding portions SS1e, and the remaining three second protruding portions SS2e are spaced apart in the first direction DR1 between the first spacer MS1 and the second spacer MS2 and may be arranged at equal intervals. The first protruding portion SS1e may be spaced apart from the spacers in another column in the second direction DR2.

Figure 13:
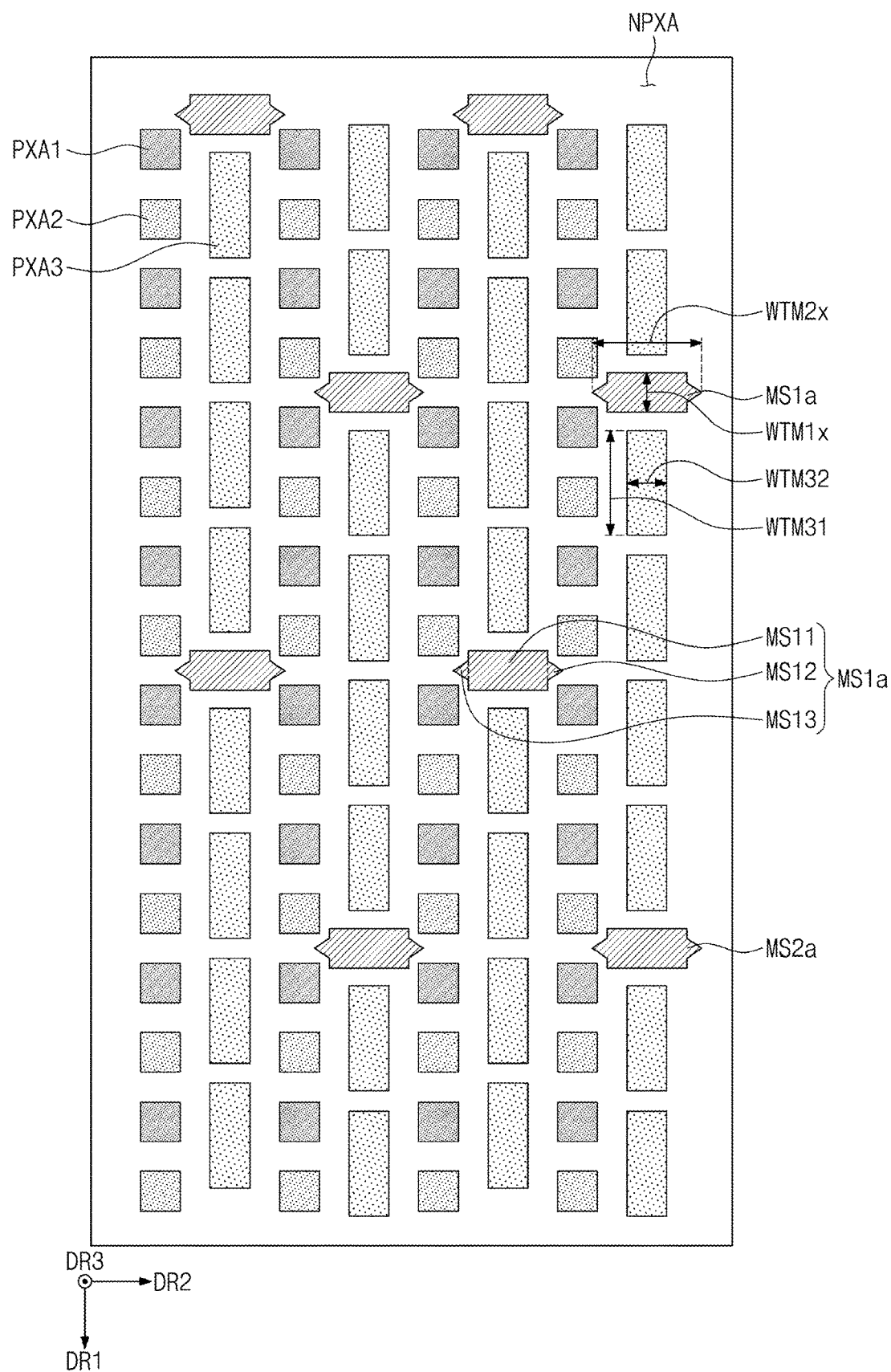
FIG. 13 is a plan view illustrating a partial configuration of a display panel according to one or more embodiments of the present disclosure.

FIG. 13 is a plan view illustrating a partial configuration of a display panel according to one or more embodiments of the present disclosure.

Referring to FIG. 13, each of the first spacer MS1a and the second spacer MS2a may include a first portion MS11, a second portion MS12, and a third portion MS13. Each of the second portion MS12 and the third portion MS13 may protrude from the first portion MS11. The second portion MS12 and the third portion MS13 may be spaced apart from each other with the first portion MS11 therebetween.

When viewed from a plane, the first portion MS11 may have a square shape, and each of the second portion MS12 and the third portion MS13 may have a triangular shape. The first portion MS11, the second portion MS12, and the third portion MS13 may have an integral shape connected to each other.

The first portion MS11 of the first spacer MS1a may be referred to as a first spacer, the second portion MS12 may be referred to as a first protruding portion, and the third portion MS13 may be referred to as a second protruding portion. In addition, the first portion MS11 of the second spacer MS2a may be referred to as a second spacer, the second portion MS12 may be referred to as a third protruding portion, and the third portion MS13 may be referred to as a fourth protruding portion.

The first spacer MS1a may have a first width WTM1x in the first direction DR1 and a second width WTM2x in the second direction DR2. The first width WTM1x may be smaller than the first width WTM31 in the first direction DR1 of the third emission area PXA3.

The second width WTM2x may be greater than the second width WTM32 in the second direction DR2 of the third emission area PXA3, but is not particularly limited thereto. For example, in one or more embodiments of the present disclosure, the second width WTM2x of the first spacer MS1a may be equal to or smaller than the second width WTM32 of the third emission area PXA3.

Figure 14:
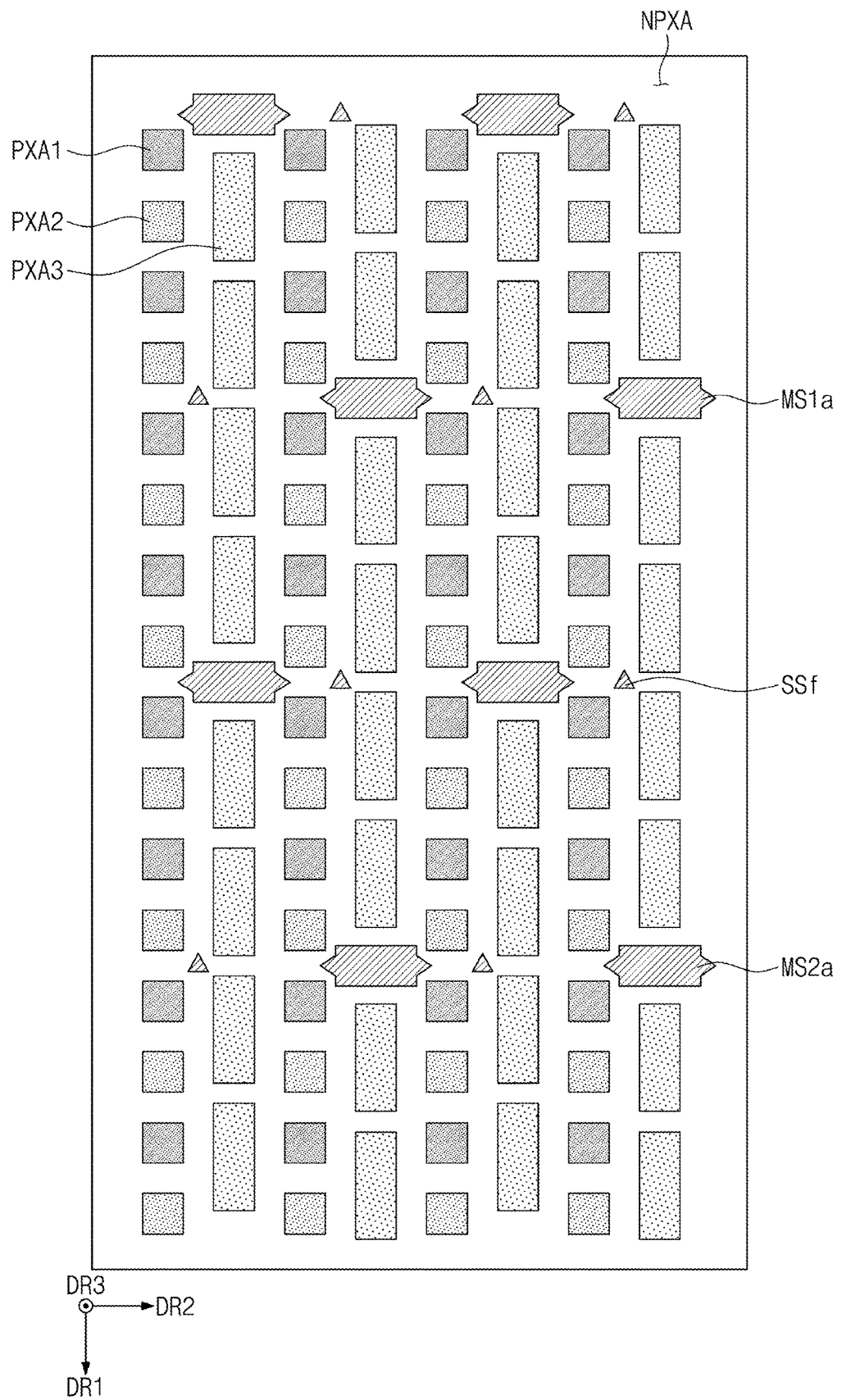
FIG. 14 is a plan view illustrating a partial configuration of a display panel according to one or more embodiments of the present disclosure.

FIG. 14 is a plan view illustrating a partial configuration of a display panel according to one or more embodiments of the present disclosure. In the description of FIG. 14, the same (or substantially similar) reference numerals are used for the same (or substantially similar) components as those described in FIG. 13, and redundant descriptions thereof are not provided.

Referring to FIG. 14, when compared with FIG. 13, a protruding portion SSf may be further added.

The protruding portion SSf may be provided in an area between the first spacer MS1a and the second spacer MS2a. The protruding portion SSf may be provided on the left side of the four third emission areas PXA3 arranged between the first spacer MS1a and the second spacer MS2a, but is not particularly limited thereto. For example, the protruding portion SSf may be provided on both the left and right sides of the four third emission areas PXA3.

The protruding portion SSf may have a triangular shape, but is not limited thereto. For example, the protruding portion SSf may be transformed into various suitable shapes such as a square, a circle, and/or a polygon.

Figure 15A:
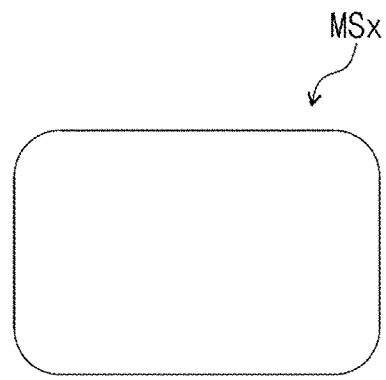
FIGS. 15A, 15B, and 15C are plan views showing shapes of spacers according to one or more embodiments of the present disclosure.
Figure 15A:
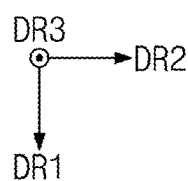
Figure 15B:
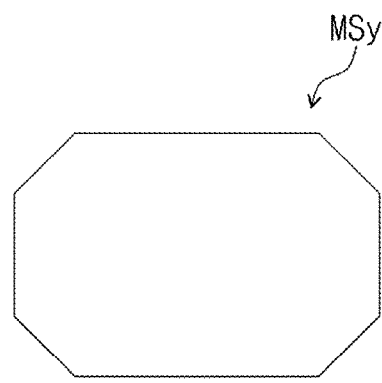
Figure 15B:
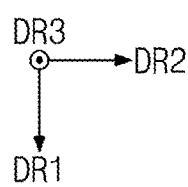
Figure 15C:
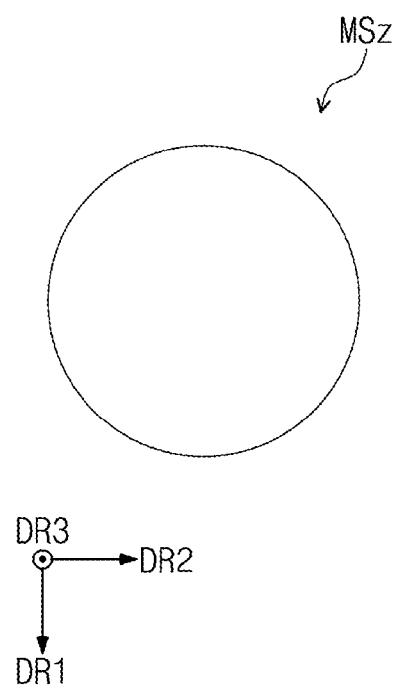

FIGS. 15A, 15B, and 15C are plan views showing shapes of spacers according to one or more embodiments of the present disclosure.

Referring to FIG. 15A, the spacer MSx may have a shape having at least 4 curves (e.g., curved portions) and 4 straight lines. For example, in the spacer MSx, each vertex part in a rectangle may correspond to a curved shape (e.g., curved portion).

Referring to FIG. 15B, the spacer MSy may have a polygonal shape. For example, the spacer MSy may have a chamfered shape in which a corner part in a rectangular shape is cut obliquely. In FIG. 15B, a shape in which all four corners of a rectangle are chamfered is illustrated as an example, but is not particularly limited thereto. For example, only some of the four corners may be chamfered.

Referring to FIG. 15C, the spacer MSz may be circular. The spacer MSz may have an elliptical shape or may be any suitable figure consisting only of a curve.

The shapes of the spacers MSx, MSy, and MSz shown in FIGS. 15A, 15B, and 15C only illustrate some embodiments and the present disclosure is not limited thereto.

Figure 16A:
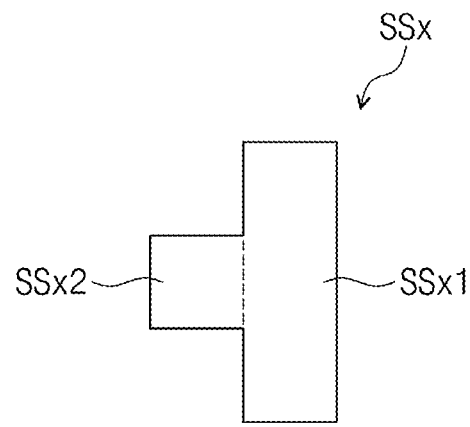
FIGS. 16A, 16B, and 16C are plan views showing shapes of a protruding portion according to one or more embodiments of the present disclosure.
Figure 16A:
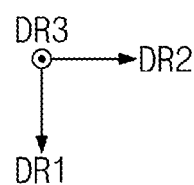
Figure 16B:
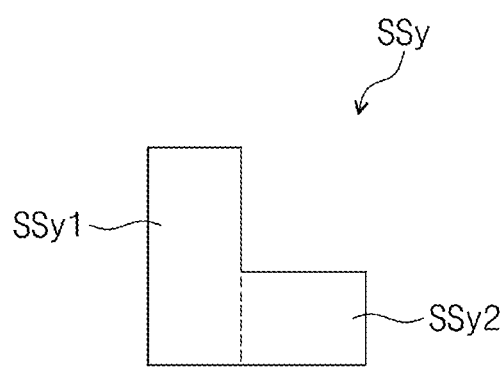
Figure 16B:
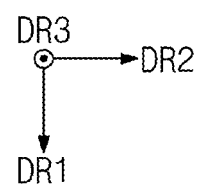
Figure 16C:
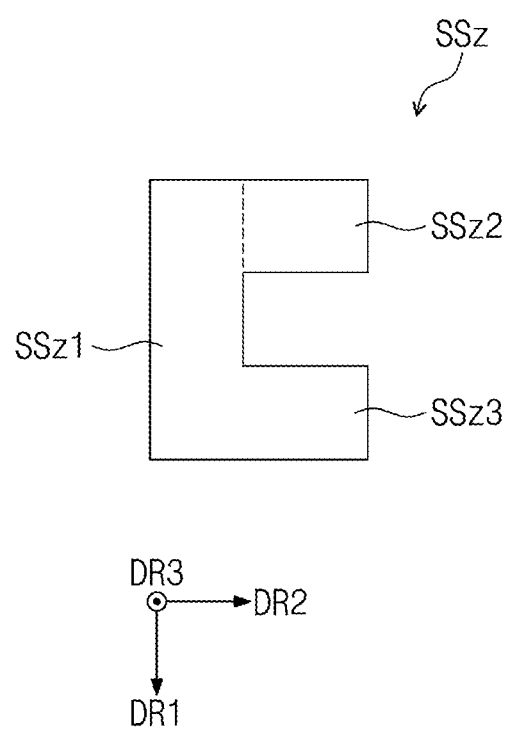

FIGS. 16A, 16B, and 16C are plan views showing shapes of a protruding portion according to one or more embodiments of the present disclosure.

Referring to FIG. 16A, the protruding portion SSx may include a first portion SSx1 extending in a first direction DR1 and a second portion SSx2 protruding from the first portion SSx1. The second portion SSx2 may extend in a direction parallel to the second direction DR2 from the first portion SSx1.

FIG. 16A illustrates an example in which the second portion SSx2 protrudes from the central area of the first portion SSx1, but is not particularly limited thereto. The second portion SSx2 may extend from an area skewed toward one end from the central area in the longitudinal direction of the first portion SSx1.

Referring to FIG. 16B, the protruding portion SSy includes a first portion SSy1 extending in a first direction DR1 and a second portion SSy2 extending in the second direction DR2 from the end of the first portion SSy1.

Referring to FIG. 16C, the protruding portion SSz may include a first portion SSz1 extending in the first direction DR1, a second portion SSz2 extending in the second direction DR2 from the first end portion of the first portion SSz1, and a third portion SSz3 extending in the second direction DR2 from the second end portion of the first portion SSz1.

The shapes of the protruding portions SSx, SSy, and SSz shown in FIGS. 16A, 16B, and 16C are only illustrate some embodiments and the present disclosure is not limited thereto.

Figure 17:
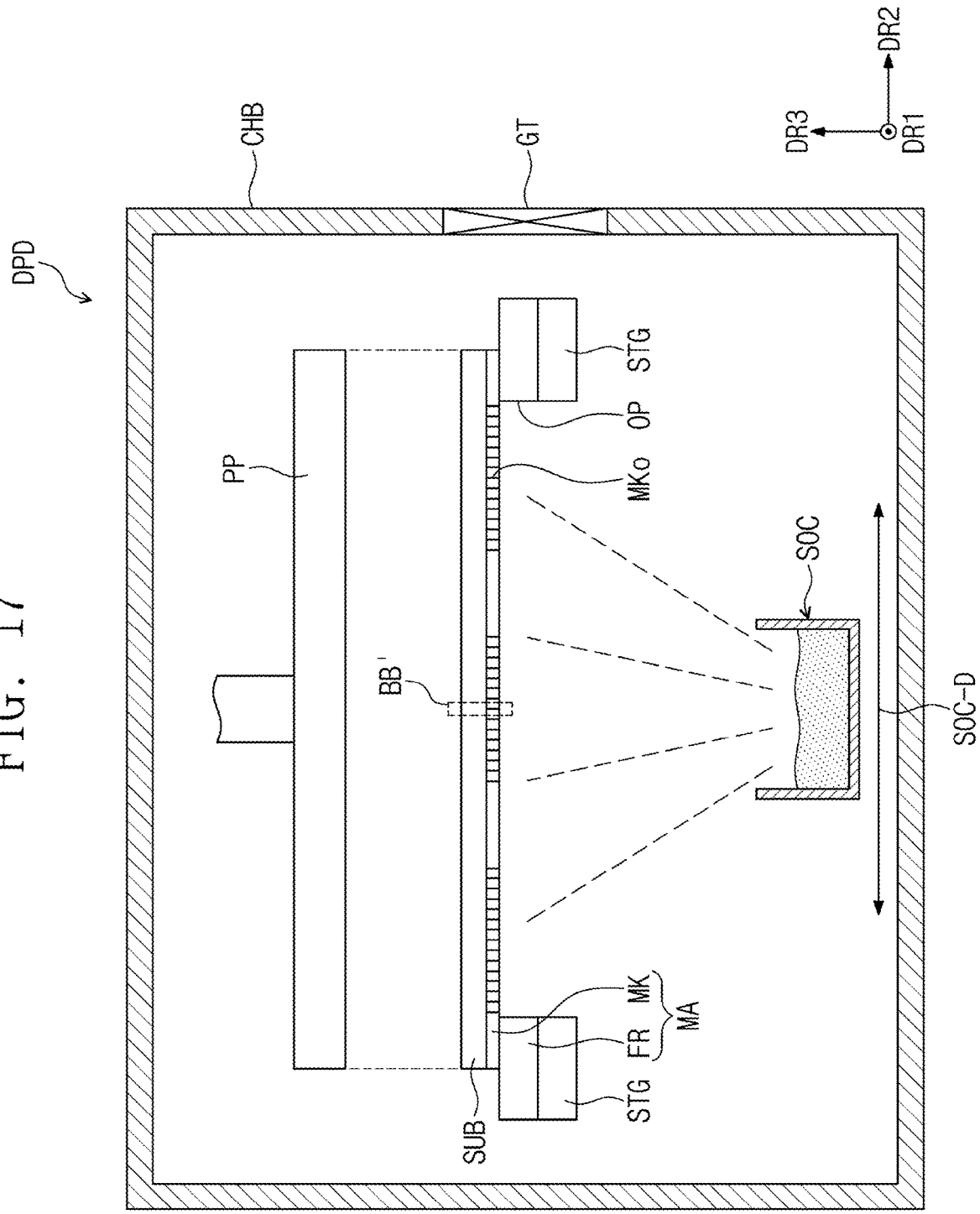
FIG. 17 is a diagram illustrating a part of a process of manufacturing a display panel according to one or more embodiments of the present disclosure.
Figure 18:
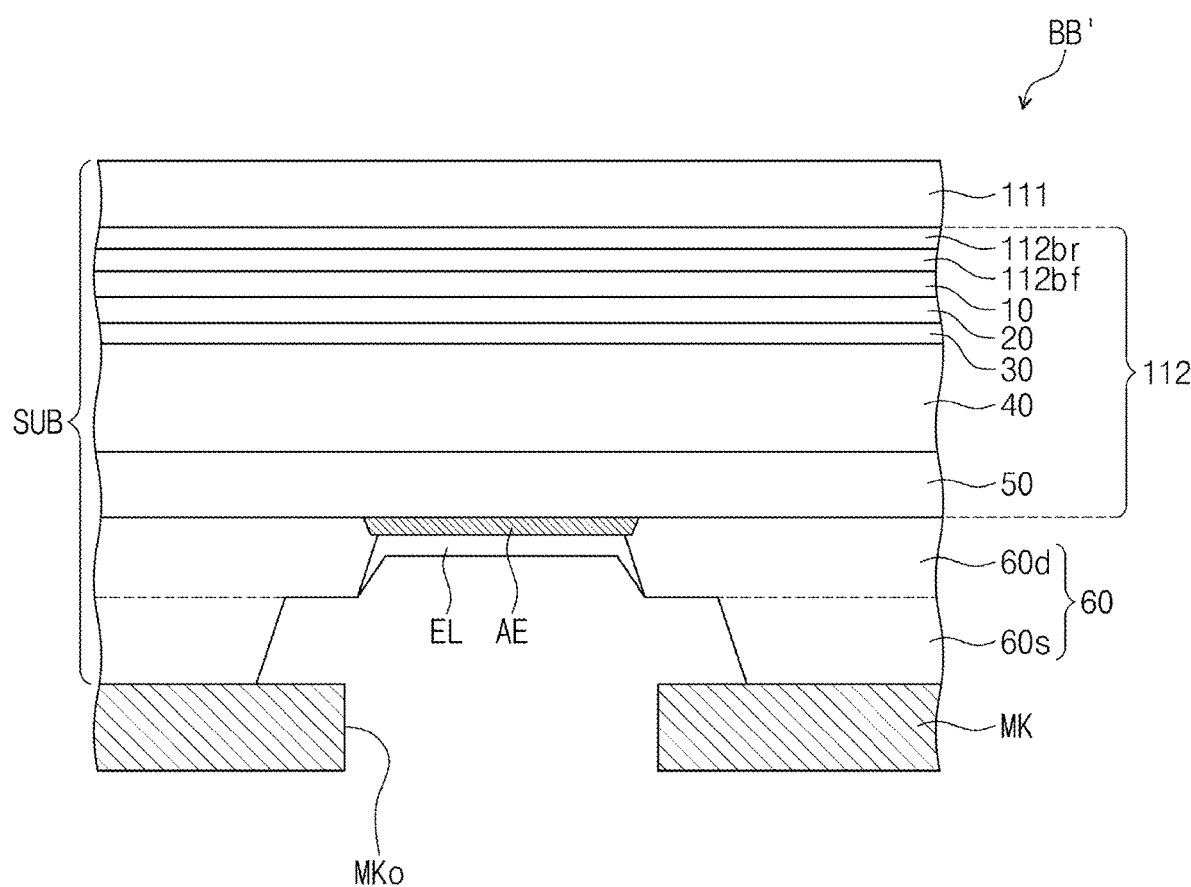
FIG. 18 is a diagram illustrating an enlarged area BB' of FIG. 17.

FIG. 17 is a diagram illustrating a part of a process of manufacturing a display panel according to one or more embodiments of the present disclosure. FIG. 18 is a diagram illustrating an enlarged area BB' of FIG. 17.

Referring to FIGS. 17 and 18, a deposition device DPD may include a chamber CHB, a deposition source SOC, a stage STG, a moving plate PP, and a mask assembly MA.

The chamber CHB provides an enclosed space. The deposition source SOC, the stage STG, the moving plate PP, and the mask assembly MA may be in the chamber CHB. The chamber CHB may include at least one gate GT. The chamber CHB may be opened and closed by the gate GT. The target substrate SUB may enter and exit through the gate GT provided in the chamber CHB.

The deposition source SOC includes a deposition material. In this case, the deposition material is any suitable material capable of sublimation and/or vaporization, and may include one or more of inorganic, metal, and organic materials. A case where the deposition source SOC according to the present embodiments includes an organic material for manufacturing an organic light emitting element will be described as an example.

The deposition source SOC may extend along the first direction DR1. The deposition source SOC may reciprocate (e.g., may go back and forth) in the deposition source movement direction SOC-D parallel to the second direction DR2, but is not particularly limited thereto.

The stage STG is on the deposition source SOC. The mask assembly MA may be mounted on the stage STG. The mask assembly MA may face the deposition source SOC. The stage STG may support the mask assembly MA by overlapping a frame FR of the mask assembly MA. The stage STG may not overlap an opening OP of the frame FR. For example, the stage STG may be outside the movement path of the deposition material supplied from the deposition source SOC to the target substrate SUB.

The mask assembly MA may include the frame FR and a mask MK. The frame FR may have a ring shape when viewed on a plane. For example, the opening OP may be provided in a central area of the frame FR. The opening OP may be a hole penetrating from the upper surface of the frame FR to the lower surface of the frame FR. The mask MK is on the frame FR and may be coupled to the frame FR. A plurality of masks MK may be provided, and will be referred to as masks MK.

A plurality of opening patterns MKo may be defined in each of the masks MK. The plurality of opening patterns MKo may overlap the opening OP. The opening patterns MKo may be through-holes passing through the lower surfaces of the masks MK from the upper surfaces of the masks MK.

The target substrate SUB is on the mask assembly MA. The deposition material may pass through the opening patterns MKo to be deposited on the target substrate SUB.

The moving plate PP may align the target substrate SUB on the mask assembly MA. For example, the moving plate PP may generate an electrostatic force or a magnetic force to move the target substrate SUB. The moving plate PP may be movable vertically and/or horizontally.

The moving plate PP according to one or more other embodiments of the present disclosure may fix the target substrate SUB on the mask assembly MA. Because the target substrate SUB is fixed on the mask assembly MA by the moving plate PP, the precision of the deposition process may be improved.

Referring to FIG. 18, the mask MK may contact the target substrate SUB. A deposition material may be deposited on the target substrate SUB exposed by the opening pattern MKo of the mask MK.

The target substrate SUB may be, for example, a substrate on which the base substrate 111, the circuit layer 112, the pixel electrode AE, and the sixth insulating layer 60 are formed. The sixth insulating layer 60 may include a pixel defining film 60d and a spacer 60s. The spacer 60s may be a part protruding more than the pixel defining film 60d. The spacer 60s corresponds to a part including a spacer and a protruding portion described with reference to the previous embodiments.

The mask MK may contact the sixth insulating layer 60. The opening pattern MKo of the mask MK may overlap the opening of the sixth insulating layer 60 on a plane (e.g., in the third direction DR3). The deposition material may be formed on the pixel electrode AE by passing through the opening pattern MKo of the mask MK. For example, a light emitting layer EL may be formed on the pixel electrode AE. The deposition material may be a material constituting the light emitting layer EL. For example, the light emitting layer EL may be formed of a deposition material deposited on the target substrate SUB.

The light emitting layer EL may include a light emitting material. For example, the light emitting layer EL may be formed of at least one of materials capable of emitting red, green, or blue light. The light emitting layer EL may include a fluorescent material and/or a phosphorescent material. The light emitting layer EL may include an organic light emitting material and/or an inorganic light emitting material.

Figure 19A:
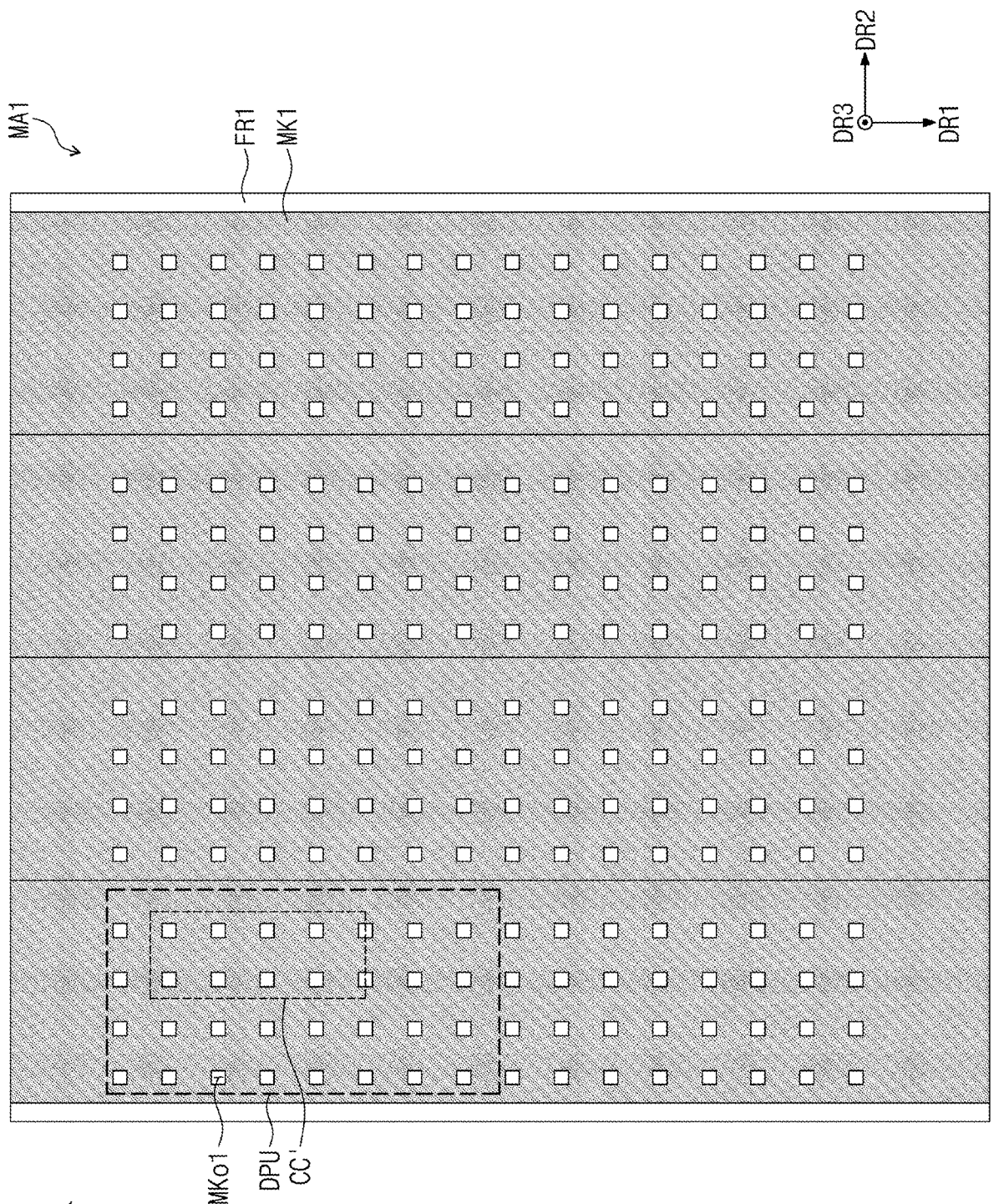
FIG. 19A is a plan view illustrating a first mask assembly used when forming light emitting layers.
Figure 19B:
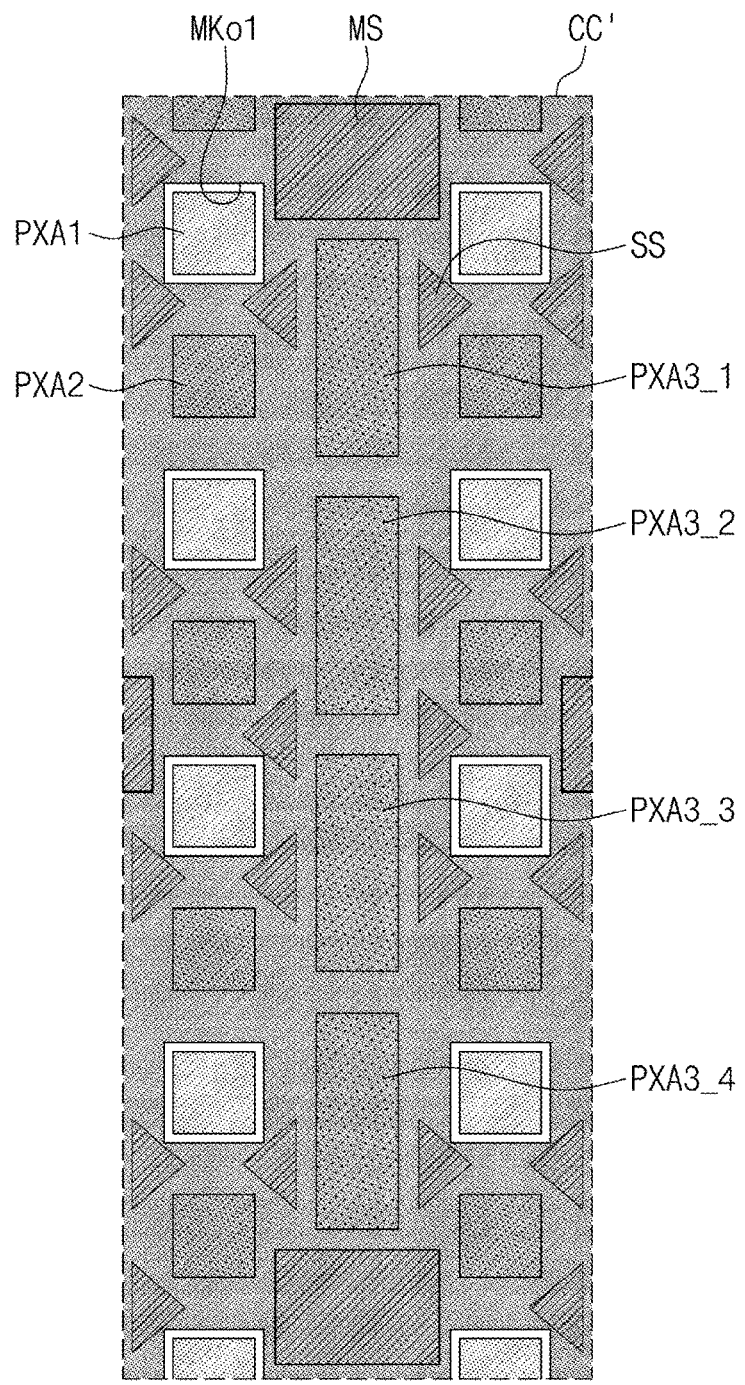
FIG. 19B is a diagram illustrating an enlarged area CC' of FIG. 19A.
Figure 20A:
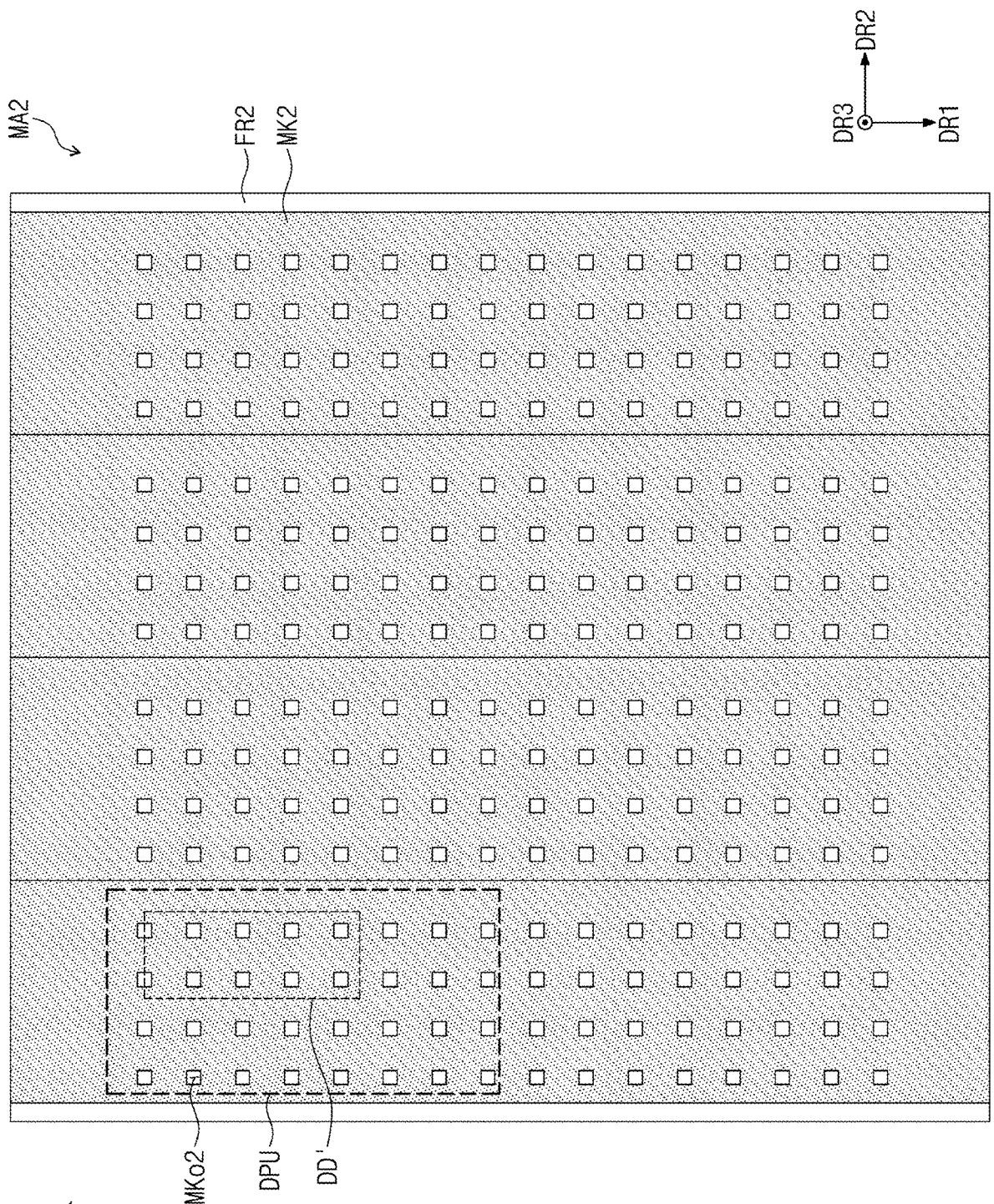
FIG. 20A is a plan view illustrating a second mask assembly used when forming light emitting layers.
Figure 20B:
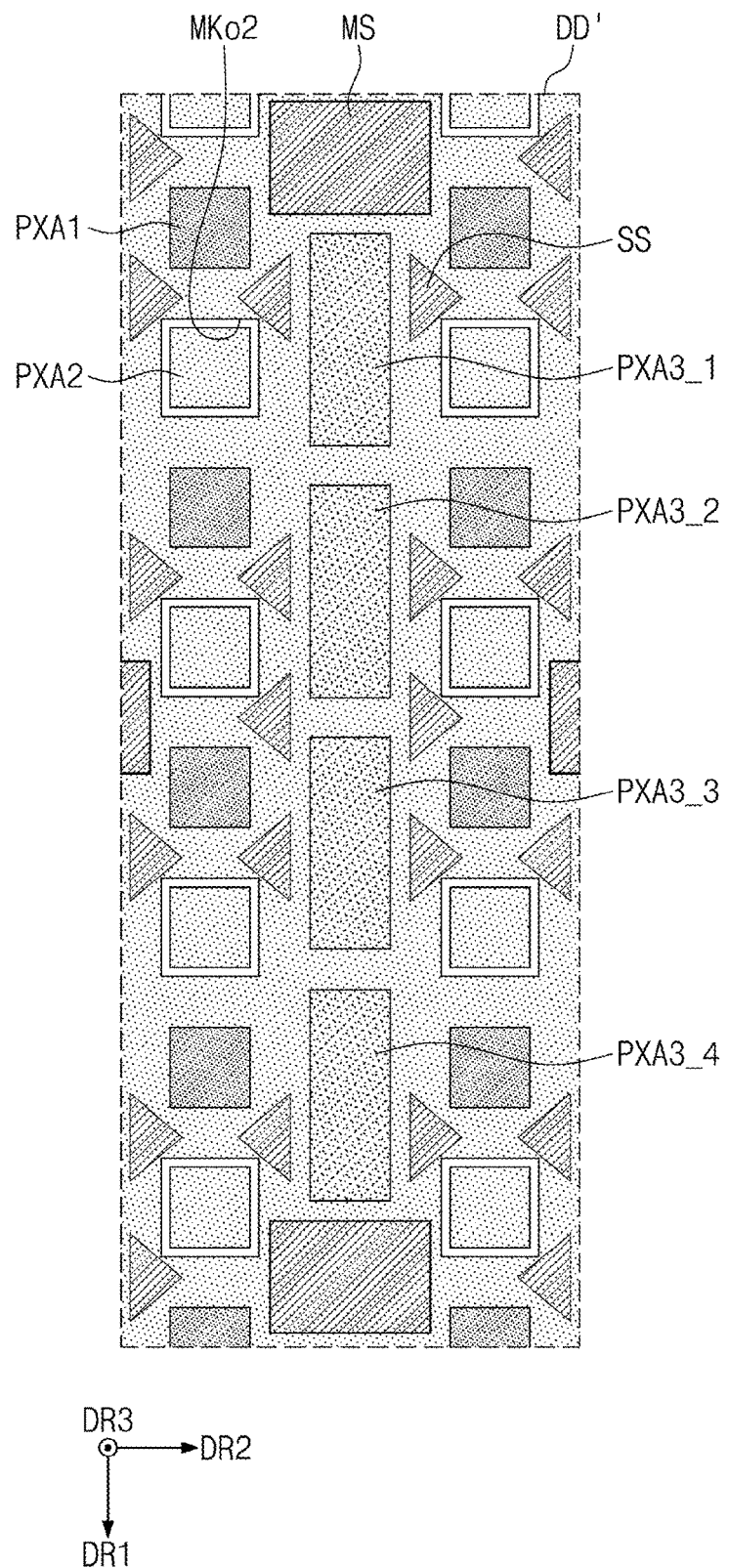
FIG. 20B is an enlarged view of an area DD' of FIG. 20A.

FIG. 19A is a plan view illustrating a first mask assembly used when forming light emitting layers. FIG. 19B is a diagram illustrating an enlarged view of an area CC' of FIG. 19A. FIG. 20A is a plan view illustrating a second mask assembly used when forming light emitting layers. FIG. 20B is an enlarged view of an area DD' of FIG. 20A.

Referring to FIGS. 17, 19A, and 19B, the first mask assembly MA1 may include a first frame FR1 and first masks MK1. The first masks MK1 may be stretched and bonded to the first frame FR1 through a welding process.

Light emitting layers may be formed in the first emission areas PXA1 by using the first mask assembly MA1. First opening patterns MKo1 may be formed in each of the first masks MK1. The first opening patterns MKo may be open areas corresponding to the first emission areas PXA1, respectively.

The first masks MK1 may be supported by spacers MS and protruding portions SS. The second emission areas PXA2 and the third emission areas PXA3_1, PXA3_2, PXA3_3, and PXA3_4 may be covered by the first masks MK1.

The target substrate SUB may include a plurality of display panel units DPU. In FIG. 19A, an area corresponding to one display panel unit DPU is indicated by a dotted line. For example, a light emitting layer may be formed in the first emission areas PXA1 of the plurality of display panels using one first mask assembly MA1.

Referring to FIGS. 17, 20A, and 20B, the second mask assembly MA2 may include a second frame FR2 and second masks MK2. The second masks MK2 may be stretched and bonded to the second frame FR2 through a welding process.

Light emitting layers may be formed in the second emission areas PXA2 by using the second mask assembly MA2. Second opening patterns MKo2 may be formed in each of the second masks MK2. The second opening patterns MKo2 may be open areas respectively corresponding to the second emission areas PXA2.

The second masks MK2 may be supported by spacers MS and protruding portions SS. The first emission areas PXA1 and the third emission areas PXA3_1, PXA3_2, PXA3_3, and PXA3_4 may be covered by the second masks MK2.

The first opening patterns MKo1 may respectively correspond to the first emission areas PXA1 (refer to FIG. 4), and the second opening patterns MKo2 may respectively correspond to the second emission areas PXA2 (refer to FIG. 4).

Figure 21A:
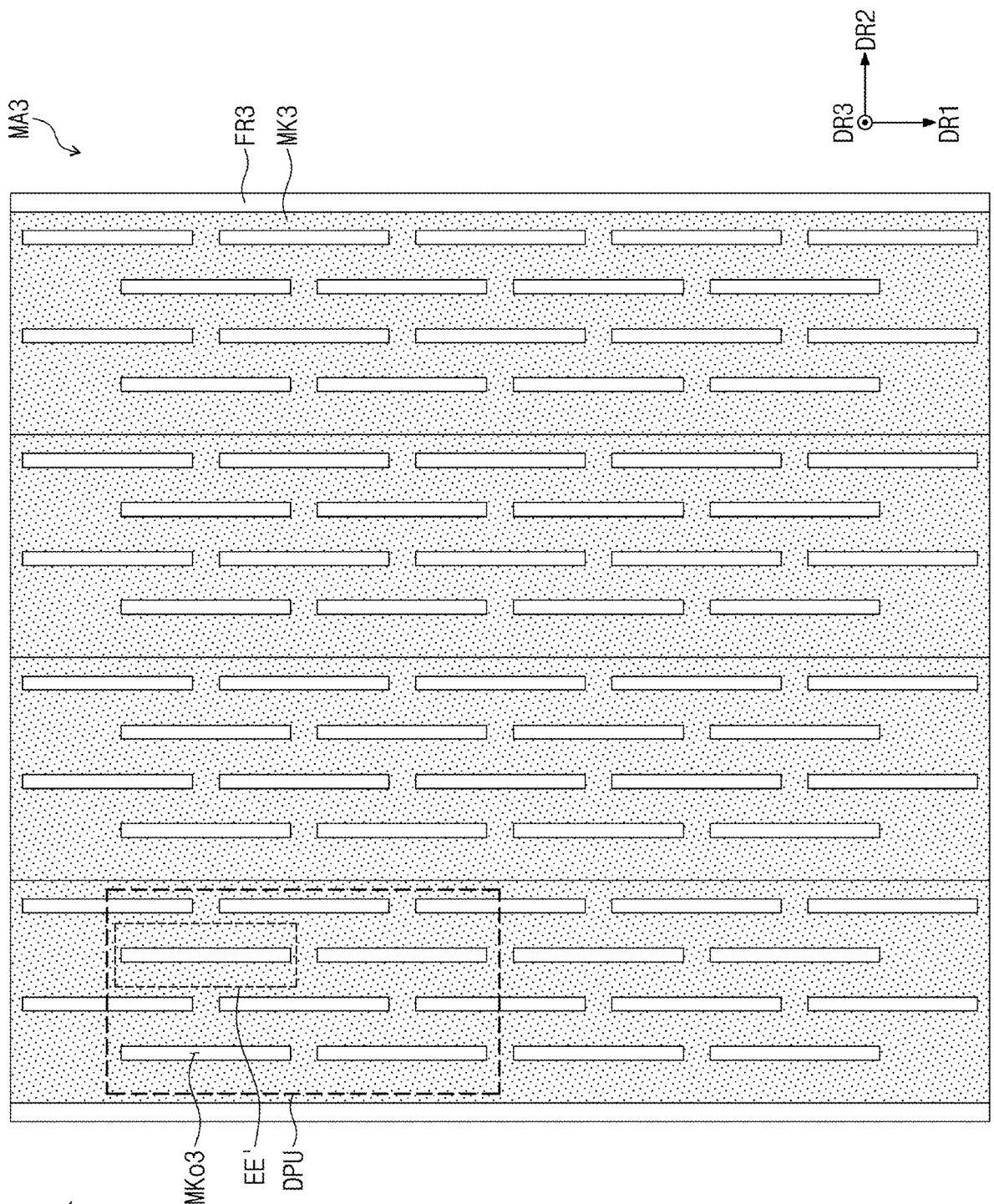
FIG. 21A is a plan view illustrating a third mask assembly used when forming light emitting layers.
Figure 21B:
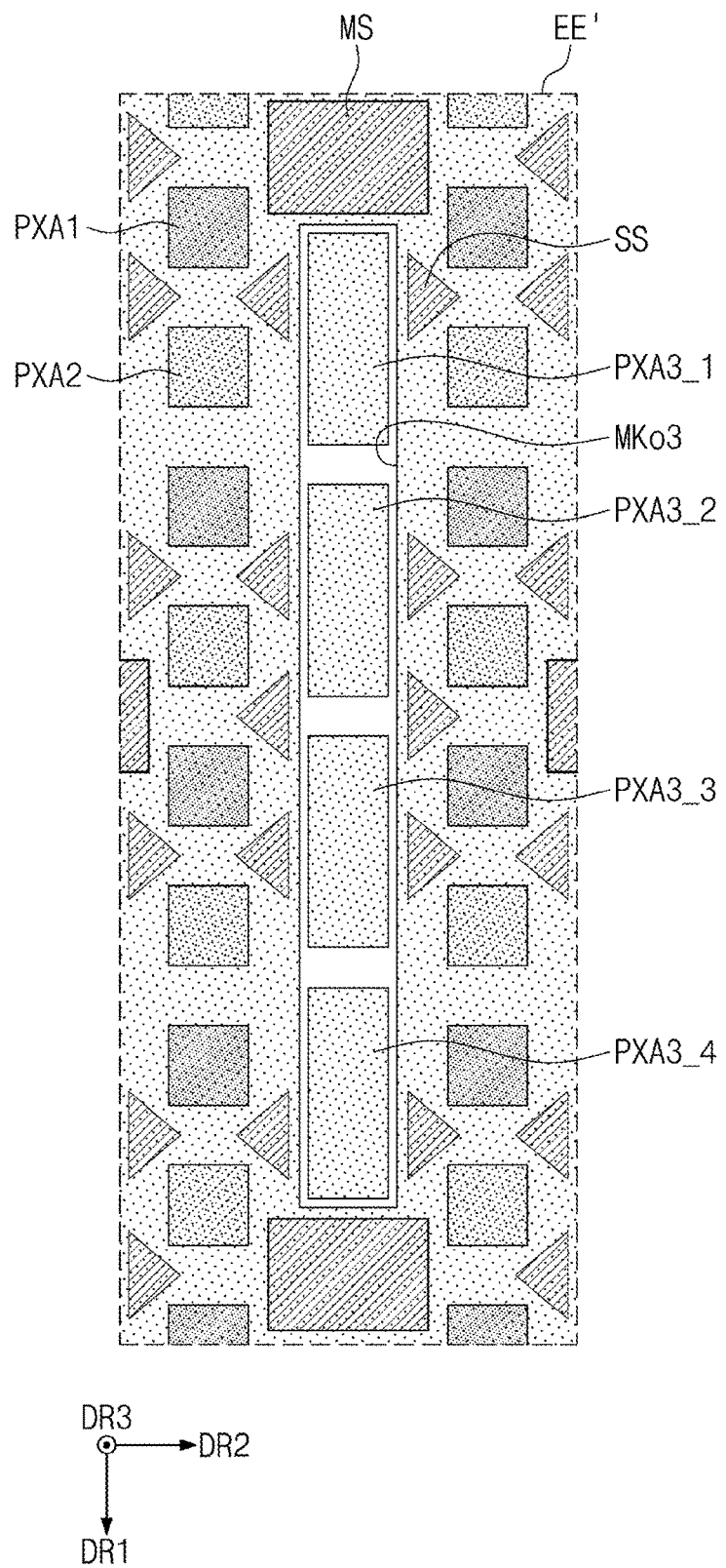
FIG. 21B is an enlarged view of an area EE' of FIG. 21A.

FIG. 21A is a plan view illustrating a third mask assembly used when forming light emitting layers. FIG. 21B is an enlarged view of an area EE' of FIG. 21A.

Referring to FIGS. 17, 21A, and 21B, the third mask assembly MA3 may include a third frame FR3 and third masks MK3. The third masks MK3 may be stretched and bonded to the third frame FR3 through a welding process.

A light emitting layer may be formed in the third emission areas PXA3_1, PXA3_2, PXA3_3, and PXA3_4 by using the third mask assembly MA3. Third opening patterns MKo3 may be formed in each of the third masks MK3. Each of the third opening patterns MKo3 may be an open area corresponding to the third emission areas PXA3_1, PXA3_2, PXA3_3, and PXA3_4.

One third opening pattern MKo3 may overlap at least four emission areas PXA3_1, PXA3_2, PXA3_3, and PXA3_4. Accordingly, one light emitting layer EL1 (see FIG. 5) may be formed in the four emission areas PXA3_1, PXA3_2, PXA3_3, and PXA3_4 (see FIG. 5) by one third opening pattern MKo3.

One third opening pattern MKo3 may have a larger size than each of one first opening pattern MKo1 (see FIG. 19A) and one second opening pattern MKo2 (see FIG. 20A).

The third masks MK3 may be supported by spacers MS and protruding portions SS. The first emission areas PXA1 and the second emission areas PXA2 may be covered by the third masks MK3.

According to one or more embodiments of the present disclosure, as the density or number of the first and second spacers MS1 and MS2 (refer to FIG. 4) decreases, the size of the third opening pattern MKo3 may be increased. In addition, the protruding portions SS (see FIG. 4) may be positioned in an area where the first and second spacers MS1 and MS2 are not provided. In this case, the masks MK1, MK2, and/or MK3 (see FIG. 19A or 20A) may be sufficiently supported during the process of forming the light emitting layer EL1 (see FIG. 5) so that the probability that the light emitting layer EU is formed in an area other than the area where the light emitting layer EU is to be formed (e.g., in an undesired area) may be eliminated or reduced.

Accordingly, a failure rate of the display panel 110 or 110_1 (refer to FIG. 2A or 2B) may be reduced, and a manufacturing yield may be improved.

Figure 22:
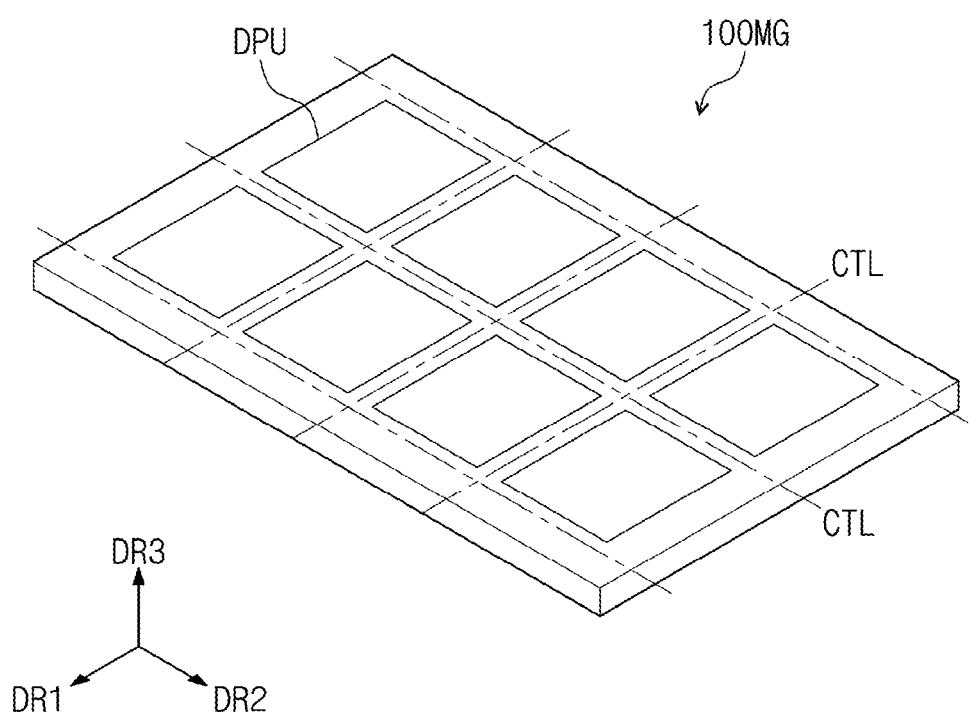
FIG. 22 is a perspective view illustrating a part of a process of manufacturing a display panel according to one or more embodiments of the present disclosure.

FIG. 22 is a perspective view illustrating a part of a process of manufacturing a display panel according to one or more embodiments of the present disclosure.

Referring to FIG. 22, a substrate 100MG including display panel units DPU may be cut along cutting lines CTL. FIG. 22 illustrates an example in which one substrate 100MG includes eight display panel units DPU, but the present disclosure is not limited thereto.

According to the above-description, a specific emission area may be increased by reducing the density and/or number of spacers. Accordingly, the lifespan of the display panel may be improved. In addition, protruding portions may be provided in an area where the spacer is not placed. In this case, during the process of forming the display panel, the probability that the light emitting layer is stamped by the mask may be removed or reduced. In addition, during the process of forming the light emitting layer, the mask is sufficiently supported, so that the probability that the light emitting layer is formed in an area other than the designed (or desired) area may be eliminated or reduced. Accordingly, a failure rate of the display panel may be reduced, and a manufacturing yield may be improved.

Although the embodiments of the present disclosure have been described, it is understood that the present disclosure should not be limited to these embodiments but various changes and modifications may be made by one ordinary skilled in the art within the spirit and scope of the present disclosure as hereinafter claimed by the following claims and their equivalents.

What is claimed is:

1. A display panel in which a plurality of first emission areas, a plurality of second emission areas, and a plurality of third emission areas are defined, the display panel comprising:
    a first spacer spaced apart from one of the plurality of third emission areas in a first direction;
    a second spacer spaced apart from the first spacer in the first direction; and
    a plurality of protruding portions spaced apart from the plurality of third emission areas in a second direction crossing the first direction, the plurality of protruding portions being arranged in the first direction between the first spacer and the second spacer,
        wherein m third emission areas among the plurality of third emission areas are between the first spacer and the second spacer,
        wherein the second spacer is a spacer closest to the first spacer in the first direction,
        wherein the plurality of first emission areas are red emission areas, the plurality of second emission areas are green emission areas, and a plurality of third emission areas are blue emission areas,
        wherein m is an integer greater than or equal to 4,
        wherein the plurality of protruding portions between the first spacer and the second spacer comprises a first protruding portion, a second protruding portion, and a third protruding portion, the first, second, and third protruding portions being consecutively numbered and being provided according to the numbered order,
        wherein a first interval between the first protruding portion and the second protruding portion is greater than a second interval between the second protruding portion and the third protruding portion, and
        wherein no protruding portions are disposed between the first protruding portion and the second protruding portion.

2. The display panel of claim 1, wherein the plurality of protruding portions have the same shape.

3. The display panel of claim 1, wherein
    the plurality of protruding portions further comprises a fourth protruding portion and a fifth protruding portion,
    the third protruding portion and the fourth protruding portion having the second interval therebetween, and
    the fourth protruding portion and the fifth protruding portion having the first interval therebetween.

4. The display panel of claim 1, wherein the plurality of protruding portions are respectively adjacent to boundaries between adjacent third emission areas among the m third emission areas.

5. The display panel of claim 1, wherein the plurality of first emission areas and the plurality of second emission areas are alternately arranged one by one along the first direction, and
    wherein the plurality of protruding portions are respectively adjacent to boundaries between adjacent first emission area and second emission area among the plurality of first emission areas and the plurality of second emission areas.

6. The display panel of claim 1, wherein the plurality of protruding portions comprise a first protruding portion spaced apart from the first spacer in the second direction, and a second protruding portion spaced apart from the first spacer in the first direction, and
    wherein a shape of the first protruding portion and a shape of the second protruding portion are different from each other.

7. The display panel of claim 6, wherein the second protruding portion comprises a first portion between adjacent first emission area and second emission area among the plurality of first emission areas and the plurality of second emission areas, a second portion extending from a first end portion of the first portion, and a third portion extending from a second end portion of the first portion, and
    wherein a width of the first portion in the first direction is smaller than a maximum width of each of the second portion and the third portion in the first direction.

8. The display panel of claim 6, wherein an area of the first protruding portion is smaller than an area of the second protruding portion.

9. The display panel of claim 1, wherein each of the first spacer and the second spacer comprises a first portion, a second portion protruding from the first portion, and a third portion protruding from the first portion,
    wherein the second portion and the third portion are spaced apart in the second direction with the first portion therebetween, and
    wherein on a plane, a shape of the first portion is a square, and a shape of each of the second portion and the third portion is a triangle.

10. The display panel of claim 1, wherein the plurality of protruding portions comprises a first protruding portion and a second protruding portion coupled integrally with the first spacer, and a third protruding portion and a fourth protruding portion coupled integrally with the second spacer,
    wherein the first protruding portion and the second protruding portion are spaced apart in the second direction with the first spacer therebetween, and
    wherein the third protruding portion and the fourth protruding portion are spaced apart in the second direction with the second spacer therebetween.

11. The display panel of claim 1, further comprising one-light emitting layer between the first spacer and the second spacer,
wherein the one light emitting layer extends continuously between the first spacer and the second spacer and overlaps the m third emission areas.

12. The display panel of claim 11, wherein the plurality of protruding portions are adjacent to the one light emitting layer.

13. The display panel of claim 1, wherein a width of each of the plurality of third emission areas in the first direction is greater than a width of the first spacer in the first direction, and
wherein a width of each of the plurality of third emission areas in the second direction is smaller than a width of the first spacer in the second direction.

14. The display panel of claim 1, wherein a width of the first spacer in the first direction is greater than a width of each of the plurality of first emission areas and the plurality of second emission areas in the first direction, and
wherein a width of the first spacer in the second direction is greater than a width of each of the plurality of first emission areas and the plurality of second emission areas in the second direction.

15. A display panel comprising:
one light emitting layer;
a plurality of first spacers;
a second spacer spaced apart from a first spacer of the plurality of first spacers in a first direction with the one light emitting layer therebetween; and
a plurality of protruding portions arranged along the first direction and spaced apart from the one light emitting layer in a second direction crossing the first direction, the plurality of protruding portions being arranged in the first direction between the first spacer and the second spacer,
wherein the plurality of first spacers are spaced apart from each other in a second direction, crossing the first direction,
wherein the second spacer is a spacer closest to the first spacer in the first direction,
wherein the plurality of protruding portions between the first spacer and the second spacer comprises a first protruding portion and a second protruding portion,
wherein the first protruding portion is substantially aligned with the plurality of first spacers in the second direction,
wherein a distance between two of the plurality of first spacers closest to each other in the second direction is less than a distance between the first spacer and the second spacer in the first direction, and
wherein a size of the first protruding portion is smaller than a size of the second protruding portion.

16. The display panel of claim 15, wherein an area of each of the first spacer and the second spacer is larger than an area of each of the plurality of protruding portions.

17. The display panel of claim 15, wherein
a first interval between the first protruding portion and the second protruding portion is greater than a second interval between one second protruding portion and another second protruding portion closest to the one second protruding portion in the first direction.

18. The display panel of claim 15, wherein the plurality of protruding portions further comprises four second protruding portions and one first protruding portion arranged in the first direction between the first spacer and the second spacer, and
wherein the first spacer, two second protruding portions of the four second protruding portions, the first protruding portion, other two second protruding portions of the four second protruding portions, and the second spacer are arranged sequentially in this order along the first direction.

19. The display panel of claim 15, further comprising a first light emitting layer and a second light emitting layer spaced apart in the second direction from the one light emitting layer,
wherein the second protruding portion is disposed between the first light emitting layer and the second light emitting layer.

20. An electronic device comprising a display panel in which a plurality of first emission areas, a plurality of second emission areas, and a plurality of third emission areas are defined, the display panel comprising:
a first spacer spaced apart from one of the plurality of third emission areas in a first direction;
a second spacer spaced apart from the first spacer in the first direction; and
a plurality of protruding portions spaced apart from the plurality of third emission areas in a second direction crossing the first direction, the plurality of protruding portions being arranged in the first direction between the first spacer and the second spacer,
wherein m third emission areas among the plurality of third emission areas are between the first spacer and the second spacer,
wherein the second spacer is a spacer closest to the first spacer in the first direction,
wherein the plurality of first emission areas are red emission areas, the plurality of second emission areas are green emission areas, and a plurality of third emission areas are blue emission areas,
wherein m is an integer greater than or equal to 4,
wherein the plurality of protruding portions between the first spacer and the second spacer comprises a first protruding portion, a second protruding portion, and a third protruding portion, the first, second, and third protruding portions being consecutively numbered and being provided according to the numbered order,
wherein a first interval between the first protruding portion and the second protruding portion is greater than a second interval between the second protruding portion and the third protruding portion, and
wherein no protruding portions are disposed between the first protruding portion and the second protruding portion.

* * * * *